US011737242B2

(12) United States Patent
Cao et al.

(10) Patent No.: US 11,737,242 B2
(45) Date of Patent: Aug. 22, 2023

(54) HEAT DISSIPATION APPARATUS AND SERVER

(71) Applicant: HUAWEI TECHNOLOGIES CO., LTD., Guangdong (CN)

(72) Inventors: Lei Cao, Shenzhen (CN); Shoubiao Xu, Shenzhen (CN); Shanjiu Chi, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 17/949,801

(22) Filed: Sep. 21, 2022

(65) Prior Publication Data

US 2023/0032386 A1 Feb. 2, 2023

Related U.S. Application Data

(63) Continuation of application No. 17/089,089, filed on Nov. 4, 2020, now Pat. No. 11,490,545, which is a
(Continued)

(30) Foreign Application Priority Data

May 24, 2018 (CN) .......................... 201810509162.6

(51) Int. Cl.
*H05K 7/20* (2006.01)
*G06F 1/20* (2006.01)

(52) U.S. Cl.
CPC .......... *H05K 7/20418* (2013.01); *G06F 1/20* (2013.01); *H05K 7/20709* (2013.01)

(58) Field of Classification Search
CPC .......... H05K 7/20709; H05K 7/20336; H05K 7/20418; H05K 7/20309; H05K 7/20809;
(Continued)

(56) References Cited

U.S. PATENT DOCUMENTS 6,180,436 B1 1/2001 Koors et al.
6,659,168 B1 12/2003 Barsun
(Continued)

FOREIGN PATENT DOCUMENTS

CN 2831713 Y 10/2006
CN 201726637 U 1/2011
(Continued)

*Primary Examiner* — Adam B Dravininkas
(74) *Attorney, Agent, or Firm* — Womble Bond Dickinson (US) LLP

(57) ABSTRACT

A heat dissipation apparatus includes a heat dissipation substrate, a heat dissipation component, and a plurality of heat dissipation fins disposed on a first side of the heat dissipation substrate. The heat dissipation fins are configured to dissipate heat on the heat dissipation substrate. A first surface of the heat dissipation component is fastened on a second side of the heat dissipation substrate. There is a gap between a side surface of the heat dissipation component and the heat dissipation substrate, and a second surface of the heat dissipation component is used to be attached to a first to-be-heat-dissipated component, to dissipate heat on the first to-be-heat-dissipated component. An area that is on the second side of the heat dissipation substrate is used to be attached to another to-be-heat-dissipated component. Heating power of the first to-be-heat-dissipated component is greater than heating power of the another to-be-heat-dissipated component.

20 Claims, 8 Drawing Sheets

Related U.S. Application Data continuation of application No. PCT/CN2018/118909, filed on Dec. 3, 2018.

(58) Field of Classification Search
CPC ............... H05K 7/20518; H05K 7/208; H05K 7/20818; H05K 7/2039
See application file for complete search history.

(56) References Cited

U.S. PATENT DOCUMENTS

| | | | |
|---|---|---|---|
| 8,109,322 B2 | 2/2012 | Huang | |
| 8,564,957 B2* | 10/2013 | Usui | H05K 7/20509 |
| | | | 361/720 |
| 8,982,559 B2* | 3/2015 | Ohsawa | H01L 23/3677 |
| | | | 257/713 |
| 9,355,997 B2* | 5/2016 | Katkar | H01L 23/3135 |
| 9,466,597 B2* | 10/2016 | Liu | H01L 23/3675 |
| 9,504,186 B2 | 11/2016 | Dixler et al. | |
| 2002/0159233 A1 | 10/2002 | Patel et al. | |
| 2005/0068739 A1* | 3/2005 | Arvelo | H01L 23/3675 |
| | | | 257/E23.09 |
| 2008/0101025 A1* | 5/2008 | Harris | H05K 1/141 |
| | | | 257/E23.09 |
| 2008/0266885 A1 | 10/2008 | Sun et al. | |
| 2012/0211211 A1 | 8/2012 | Shih | |
| 2013/0039012 A1 | 2/2013 | Shih et al. | |
| 2013/0128461 A1 | 5/2013 | Nagasawa | |
| 2017/0028869 A1 | 2/2017 | Boddakayala et al. | |
| 2017/0045306 A1 | 2/2017 | Tsai | |
| 2019/0269004 A1 | 8/2019 | Mitsui | |

FOREIGN PATENT DOCUMENTS

| | | |
|---|---|---|
| CN | 102271479 A | 12/2011 |
| CN | 204697453 U | 10/2015 |
| CN | 1055115 A | 4/2016 |
| CN | 106197108 A | 12/2016 |
| CN | 106659094 A | 5/2017 |
| CN | 206237722 U | 6/2017 |
| CN | 108762442 A | 11/2018 |
| DE | 202015008724 U1 | 3/2016 |
| JP | 09283675 A | 10/1997 |
| JP | 2002289750 A | 10/2002 |

* cited by examiner

HEAT DISSIPATION APPARATUS AND SERVER

CROSS-REFERENCE TO RELATED APPLICATIONS

This is a continuation of U.S. patent Ser. No. 17/089,089, filed on Nov. 4, 2020, which is a continuation of International Application No. PCT/CN2018/118909, filed on Dec. 3, 2018, which claims priority to Chinese Patent Application No. 201810509162.6, filed on May 24, 2018. All of the aforementioned applications are hereby incorporated by reference in their entireties.

TECHNICAL FIELD

The present disclosure relates to the field of hardware heat dissipation technologies, and in particular, to a heat dissipation apparatus, a method for manufacturing the heat dissipation apparatus, and a server.

BACKGROUND

Continuously improved performance of a chip in a server accompanies increasing heat generated by the chip. In addition, because an integration level of an internal component of the server is relatively high, heat in the server is highly centralized. Therefore, how to effectively dissipate the heat in the server is a problem to be urgently resolved.

The chip in the server may include a processing chip, a storage chip, and another chip with low power consumption. The processing chip may include a central processing unit (CPU), a graphics processing unit (GPU), and the like. The storage chip may include a high bandwidth memory (HBM) chip. Usually, the processing chip, the storage chip, and the another chip with low power consumption are packaged in a same packaged chip. In a related technology, a heat dissipation apparatus is configured to dissipate heat for the packaged chip. The heat dissipation apparatus includes a heat dissipation substrate and a plurality of heat dissipation fins evenly arranged on the heat dissipation substrate. The heat dissipation substrate is an overall structure, and is attached to a surface of the packaged chip, to exchange heat with the packaged chip. The heat dissipation fins are configured to exchange heat with the heat dissipation substrate, to dissipate heat on the heat dissipation substrate, and further dissipate heat for the packaged chip.

However, there are chips with different generated heat in the packaged chip. For example, heat generated by the HBM chip is different from that generated by the GPU. When a related technology is used to dissipate heat for the packaged chip, heat may be transferred between the chips with different generated heat by using a substrate, resulting in mutual impact between heat of the different chips. Consequently, efficiency of dissipating heat for the packaged chip is relatively low.

SUMMARY

This application provides a heat dissipation apparatus, a method for manufacturing the heat dissipation apparatus, and a server, to resolve a problem in a related technology that efficiency of dissipating heat for a packaged chip is relatively low. Technical solutions provided in this application are as follows.

According to a first aspect, this application provides a heat dissipation apparatus. The heat dissipation apparatus includes a heat dissipation substrate, a heat dissipation component, and a plurality of heat dissipation fins disposed on a first side of the heat dissipation substrate. The heat dissipation fins are configured to dissipate heat on the heat dissipation substrate. A first surface of the heat dissipation component is fastened on a second side of the heat dissipation substrate, and there is a gap between a side surface of the heat dissipation component and the heat dissipation substrate. A second surface of the heat dissipation component is used to be attached to a first to-be-heat-dissipated component, to dissipate heat on the first to-be-heat-dissipated component. The first side is disposed opposite to the second side, the first surface is disposed opposite to the second surface on the heat dissipation component, and the side surface is a surface on the heat dissipation component other than the first surface and the second surface. An area that is on the second side of the heat dissipation substrate and in which the heat dissipation component is not disposed is used to be attached to another to-be-heat-dissipated component, heating power of the first to-be-heat-dissipated component is greater than heating power of the another to-be-heat-dissipated component, and the another to-be-heat-dissipated component is a component other than the first to-be-heat-dissipated component.

Because there is the gap between the side surface of the heat dissipation component and the heat dissipation substrate, the heat on the first to-be-heat-dissipated component cannot be transferred from the side surface of the heat dissipation component to the another to-be-heat-dissipated component. Compared with a related technology, a heat transfer path is reduced. This reduces heat transferred between the first to-be-heat-dissipated component and the another to-be-heat-dissipated component, and further reduces heat impact between different to-be-heat-dissipated components. The heat dissipation substrate can be used to effectively dissipate heat for the another to-be-heat-dissipated component. This improves heat dissipation efficiency of the heat dissipation apparatus.

In an embodiment, when an orthographic projection of the heat dissipation component on the heat dissipation substrate may cover an orthographic projection of the first to-be-heat-dissipated component on the heat dissipation substrate, the second surface of the heat dissipation component includes an area in which the heat dissipation component is attached to the first to-be-heat-dissipated component and an area in which the heat dissipation component is no attached to a to-be-heat-dissipated component. Heat in the area in which the heat dissipation component is attached to the first to-be-heat-dissipated component may be transferred to the area in which the heat dissipation component is not attached to the to-be-heat-dissipated component, and the heat is dissipated by using the area in which the heat dissipation component is not attached to the to-be-heat-dissipated component. This increases a heat dissipation area for the first to-be-heat-dissipated component to dissipate heat, and further improves heat dissipation efficiency.

In an embodiment, a vacuum cavity is disposed in the heat dissipation component. Working substance is disposed in the vacuum cavity, a volume of the working substance is less than a volume of the vacuum cavity, and the working substance is used to dissipate heat for the to-be-heat-dissipated component.

In an embodiment, a vacuum cavity is formed by enclosing a surface that is of the heat dissipation substrate and that is located on the second side and an inner wall of the heat dissipation component. Working substance is disposed in the vacuum cavity, a volume of the working substance is less than a volume of the vacuum cavity, and the working substance is used to dissipate heat for the to-be-heat-dissipated component.

In a process in which the heat of the first to-be-heat-dissipated component is transferred to the heat dissipation substrate by using the working substance in the vacuum cavity, a phase change occurs in the working substance in the vacuum cavity, and first-time heat dissipation is implemented. After the heat is transferred to the heat dissipation substrate by using the working substance, a second-time heat dissipation may be implemented by using the heat dissipation substrate. Quick heat dissipation for the first to-be-heat-dissipated component can be implemented through the first-time heat dissipation and the second-time heat dissipation. In addition, because there is the gap between the side surface of the heat dissipation component and the heat dissipation substrate, in a process in which the heat dissipation component dissipates heat for the first to-be-heat-dissipated component, the heat on the first to-be-heat-dissipated component is not transferred to the another to-be-heat-dissipated component by using the heat dissipation substrate. Therefore, heat impact between different to-be-heat-dissipated components is reduced.

In an embodiment, a porous structure is disposed on an inner surface of the vacuum cavity. The porous structure may form a capillary structure inside the vacuum cavity. Due to capillary force provided by the capillary structure, the working substance may be limited to be in a hole that is in the vacuum cavity and that is away from the first side of the heat dissipation substrate (namely, the bottom of the vacuum cavity), so that the working substance is centrally heated, to accelerate a vaporization process of the working substance. Alternatively, the vaporized working substance may be limited to be in a hole that is in the vacuum cavity and that is close to the first side of the heat dissipation substrate (namely, the top of the vacuum cavity) in the porous structure, so that heat of the vaporized working substance is centrally dissipated, to accelerate a liquefaction process of the vaporized working substance. In addition, the liquefied working substance may flow back to the bottom of the vacuum cavity due to the capillary force provided by the capillary structure, to implement circular flow of the working substance in the vacuum cavity.

In an embodiment, the porous structure is formed by laying copper powder on the inner surface and sintering the copper powder.

In an embodiment, to ensure that the heat of the first to-be-heat-dissipated component can be effectively dissipated by using the vacuum cavity, the orthographic projection of the first to-be-heat-dissipated component on the heat dissipation substrate is located in an orthographic projection of the vacuum cavity on the heat dissipation substrate.

In addition, to improve a withstand capability and an anti-bending capability of the vacuum cavity, a support cradle may be further disposed inside the vacuum cavity.

In an embodiment, a first groove is disposed on the second side of the heat dissipation substrate, the heat dissipation component is disposed in the first groove, and the second surface of the heat dissipation component is coplanar with an opening surface of the first groove. In this way, both the heat dissipation component and the heat dissipation substrate can be well connected to the to-be-heat-dissipated component.

To further improve the heat dissipation efficiency of the heat dissipation apparatus, partition-based heat dissipation may be performed on the to-be-heat-dissipated component in a heat dissipation manner in which the heat dissipation fins are partitioned. The partition-based heat dissipation may be implemented in at least the following several manners.

In an embodiment, a spacing between every two adjacent heat dissipation fins located in a first area is less than a spacing between every two adjacent heat dissipation fins located in a second area. An orthographic projection of the first area on the heat dissipation substrate covers the orthographic projection of the first to-be-heat-dissipated component on the heat dissipation substrate, and an orthographic projection of the second area on the heat dissipation substrate covers an orthographic projection of the another to-be-heat-dissipated component on the heat dissipation substrate.

When a spacing between the heat dissipation fins in one area is different from a spacing between the heat dissipation fins in another area, a heat dissipation area in the one area in which heat dissipation is performed by using the heat dissipation fins is different from that in the another area. A heat dissipation area in an area in which a spacing between the heat dissipation fins is relatively small is relatively large, and heat can be dissipated more quickly by using the relatively large heat dissipation area.

In an embodiment, the heat dissipation apparatus further includes a protective housing fastened on the heat dissipation substrate. The protective housing covers the plurality of heat dissipation fins, and the working substance is disposed in a gap between the plurality of heat dissipation fins. The protective housing covers the plurality of heat dissipation fins to form closed space. The working substance flows in the closed space, and will not leak.

When a spacing between the heat dissipation fins in one area is different from a spacing between the heat dissipation fins in another area, and the working substance is disposed in the gap between the heat dissipation fins, there is a difference between a flow speed and a flow volume of the working substance in the one area and those in the another area. Correspondingly, heat dissipated by using the working substance is different. In this way, partition-based heat dissipation is implemented in different areas, to overcome a heat dissipation bottleneck caused by a relatively low junction temperature of the another to-be-heat-dissipated component.

In an embodiment, the heat dissipation apparatus further includes a diverter component, and the diverter component is configured to separately input, into the first area and the second area, the working substance input from a working substance inlet. A working substance outlet is disposed in each of the first area and the second area. The orthographic projection of the first area on the heat dissipation substrate covers an orthographic projection of the heat dissipation component on the heat dissipation substrate, and the orthographic projection of the second area on the heat dissipation substrate does not overlap the orthographic projection of the heat dissipation component on the heat dissipation substrate.

The working substance outlet is disposed in each of the first area and the second area. Therefore, when the working substance is separately input into the first area and the second area, based on a flow property of fluid, the working substance in the first area tends to flow out by using the working substance outlet disposed in the first area, and the working substance in the second area tends to flow out by using the working substance outlet disposed in the second area. This reduces a possibility of heat exchange between the working substance in different areas, and ensures implementation of partition-based heat dissipation.

In an embodiment, the heat dissipation apparatus further includes the diverter component. The diverter component is configured to control a flow speed of the working substance in the first area and the second area, and/or the diverter component is further configured to control a flow volume of the working substance in the first area and the second area. Then heat dissipation is performed by using the working substance with different flow speeds and/or different flow volumes, to further reduce a possibility of heat exchange between the working substance in different areas.

In an embodiment, a baffle plate is disposed on the first side that is of the heat dissipation substrate and that is close to the heat dissipation fins. The baffle plate is configured to divide an area in which the heat dissipation fins are located into the first area and the second area to implement partition of a flow path in the first area and the second area. In this way, the working substance in the first area and the working substance in the second area cannot be exchanged, and a possibility of heat exchange between the working substance in different areas is reduced.

In an embodiment, to ensure effective heat dissipation for the another to-be-heat-dissipated component, the heat dissipation apparatus further includes a heat pipe. One end of the heat pipe is embedded between the heat dissipation substrate and a second to-be-heat-dissipated component, and the other end of the heat pipe is disposed at a working substance inlet. The heat pipe is configured to transfer heat on the second to-be-heat-dissipated component to the working substance inlet (or another location with a relatively low temperature).

In an embodiment, a second groove is further disposed on a first side that is of the heat dissipation substrate and that is away from the heat dissipation fins, the heat pipe is disposed in the second groove, and a first side that is of the heat pipe and that is away from the heat dissipation fins is coplanar with an opening surface of the second groove. In this way, the heat pipe, the heat dissipation component, and the heat dissipation substrate can all be well connected to the to-be-heat-dissipated component.

In an embodiment, the volume V1 of the working substance and the volume V2 of the vacuum cavity meet: $V1=a \times V2$, and $a \in [0.3 \text{ to } 0.5]$.

In an embodiment, to minimize heat exchange between the heat dissipation component and the heat dissipation substrate connected to the heat dissipation component, a thickness of the heat dissipation substrate at the first groove is less than 5 millimeters.

In an embodiment, the support cradle is made of copper.

In addition, the heat dissipation component is connected to the heat dissipation substrate by welding.

The first to-be-heat-dissipated component includes a central processing unit CPU or a graphics processing unit GPU, and the another to-be-heat-dissipated component includes a high bandwidth memory HBM chip.

According to a second aspect, this application provides a method for manufacturing a heat dissipation apparatus, including: providing a heat dissipation substrate; disposing a plurality of heat dissipation fins on a first side of the heat dissipation substrate, where the heat dissipation fins are configured to dissipate heat on the heat dissipation substrate; and disposing a heat dissipation component on a second side of the heat dissipation substrate, where a first surface of the heat dissipation component is fastened to the heat dissipation substrate, there is a gap between a side surface of the heat dissipation component and the heat dissipation substrate, a second surface of the heat dissipation component is used to be attached to a first to-be-heat-dissipated component, to dissipate heat on the first to-be-heat-dissipated component, the first side is disposed opposite to the second side, the first surface is disposed opposite to the second surface on the heat dissipation component, the side surface is a surface on the heat dissipation component other than the first surface and the second surface, an area that is on the second side of the heat dissipation substrate and in which the heat dissipation component is not disposed is used to be attached to another to-be-heat-dissipated component, heating power of the first to-be-heat-dissipated component is greater than heating power of the another to-be-heat-dissipated component, and the another to-be-heat-dissipated component is a component other than the first to-be-heat-dissipated component.

In an embodiment, a structure having a cavity is disposed in the heat dissipation component, or the structure having a cavity is formed by enclosing a surface that is of the heat dissipation substrate and that is located on the second side and an inner wall of the heat dissipation component. The method further includes: vacuumizing the cavity; injecting working substance into the vacuumized cavity, where a volume of the injected working substance is less than a volume of the cavity, and the working substance is used to dissipate heat for a to-be-heat-dissipated component; and sealing the cavity into which the working substance is injected.

In an embodiment, the disposing a heat dissipation component on a second side of the heat dissipation substrate includes: providing a cavity structure with an opening on a first side; laying copper powder on a surface of a preset location on the second side of the heat dissipation substrate and inside the cavity structure; fastening the cavity structure inside which the copper powder is laid to the preset location on the second side of the heat dissipation substrate; and sintering the heat dissipation substrate on which the cavity structure is disposed, to obtain a heat dissipation component whose porous structure is disposed on an inner surface.

In an embodiment, before the fastening the cavity structure inside which the copper powder is laid to the preset location on the second side of the heat dissipation substrate, the method further includes: disposing a support cradle inside the cavity structure.

In an embodiment, the disposing a heat dissipation component on a second side of the heat dissipation substrate includes: providing the heat dissipation component; disposing a first groove at the preset location on the second side of the heat dissipation substrate, where a depth of the first groove is less than or equal to a thickness of the heat dissipation component in a direction of the depth; and fastening the heat dissipation component in the first groove.

The heat dissipation apparatus manufactured according to the method for manufacturing a heat dissipation apparatus provided in this embodiment of this application includes the heat dissipation substrate and the heat dissipation component. Because there is the gap between the side surface of the heat dissipation component and the heat dissipation substrate, heat on the first to-be-heat-dissipated component cannot be transferred from the side surface of the heat dissipation component to the another to-be-heat-dissipated component. Compared with a related technology, a heat transfer path is reduced. This reduces heat transferred between the first to-be-heat-dissipated component and the another to-be-heat-dissipated component, and further reduces heat impact between different to-be-heat-dissipated components. The heat dissipation substrate can be used to effectively dissipate heat for the another to-be-heat-dissipated component. This improves heat dissipation efficiency of the heat dissipation apparatus.

According to a third aspect, this application provides a server, and the server includes a server chassis and a heat dissipation apparatus. A first to-be-heat-dissipated component and another to-be-heat-dissipated component are disposed in the server chassis, and the heat dissipation apparatus includes the heat dissipation apparatus according to the first aspect.

In an embodiment, the first to-be-heat-dissipated component and the another to-be-heat-dissipated component are packaged in a packaged chip, and the heat dissipation apparatus is attached to the packaged chip.

The server provided in this application includes the heat dissipation apparatus, and the heat dissipation apparatus is configured to dissipate heat for the first to-be-heat-dissipated component and the another to-be-heat-dissipated component in the server chassis. Because the heat dissipation apparatus includes a heat dissipation substrate and a heat dissipation component, and there is a gap between a side surface of the heat dissipation component and the heat dissipation substrate, heat on the first to-be-heat-dissipated component cannot be transferred from the side surface of the heat dissipation component to the another to-be-heat-dissipated component. Compared with a related technology, a heat transfer path is reduced. This reduces heat transferred between the first to-be-heat-dissipated component and the another to-be-heat-dissipated component, and further reduces heat impact between different to-be-heat-dissipated components. The heat dissipation substrate can be used to effectively dissipate heat for the another to-be-heat-dissipated component. This improves heat dissipation efficiency of the heat dissipation apparatus, and working efficiency of the server is improved.

DESCRIPTION OF EMBODIMENTS

Figure 1:
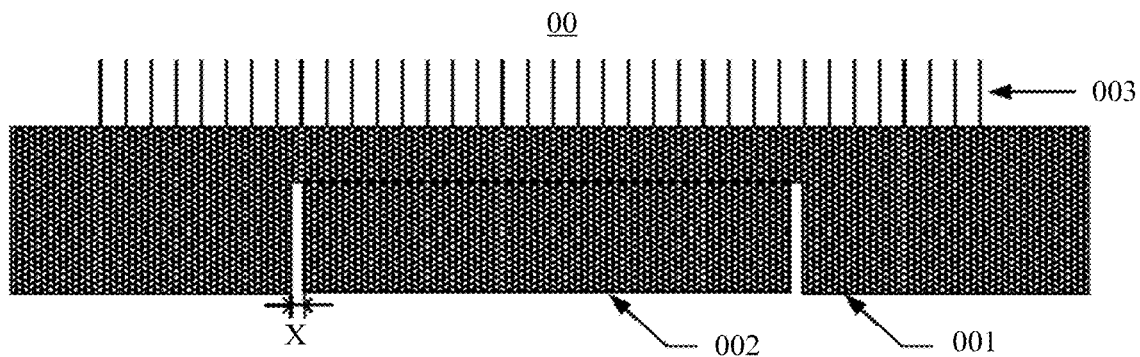
FIG. 1 is a schematic structural diagram of a heat dissipation apparatus according to an embodiment of this application.

To make the objectives, technical solutions, and advantages of this application clearer, the following further describes the embodiments of this application in detail with reference to the accompanying drawings.

Currently, a plurality of chips is usually packaged in a packaged chip. The plurality of chips includes a main chip and another chip, and the plurality of chips have a same thickness. Heating power of the main chip is greater than heating power of the another chip. For example, the main chip may be a processor chip such as a CPU or a GPU in the packaged chip, and the another chip may be an HBM chip other than the GPU in the packaged chip or another chip with relatively low power consumption. In a related technology, a heat dissipation apparatus may be configured to dissipate heat for the packaged chip. The heat dissipation apparatus includes a heat dissipation substrate and a plurality of heat dissipation fins evenly arranged on the heat dissipation substrate. The heat dissipation substrate is an overall structure, and is attached to a surface of the packaged chip, to perform heat exchange with the plurality of chips in the packaged chip. The heat dissipation fins are configured to perform heat exchange with the heat dissipation substrate, to dissipate heat on the heat dissipation substrate, and further dissipate heat for the plurality of chips in the packaged chip.

Heat generated by the main chip in a working process is usually greater than heat generated by the another chip in a working process. In addition, a case temperature (referring to a surface temperature of a chip) specification of the main chip is different from that of the another chip, and a junction temperature (referring to a maximum allowable working temperature of the chip) of the main chip is different from that of the another chip. If the heat dissipation substrate in the related technology is used to dissipate heat for the main chip and the another chip, the main chip transfers heat to the another chip by using the heat dissipation substrate. Consequently, heat of different chips is transferred to each other, and a problem occurs when heat of the another chip is dissipated. Therefore, heat dissipation efficiency of the heat dissipation apparatus in the related technology is relatively low. For example, a processor chip and a storage chip in a server are usually packaged in a same packaged chip. Heat generated by the processor chip (for example, the GPU or the CPU) may reach 250 watts to 300 watts, or even reach 400 watts to 500 watts, and a case temperature specification of the processor chip is about 100 degrees Celsius. Heat generated by the storage chip is usually less than 20 watts, and a case temperature specification of the storage chip is about 70 degrees Celsius. If the heat dissipation apparatus in the related technology is used to dissipate heat for the processor chip and the storage chip, heat on the processor chip is transferred to the storage chip by using the heat dissipation substrate. Consequently, an overtemperature phenomenon occurs on the storage chip. Further, a working status of the storage chip is affected.

To resolve a problem in a conventional technology that heat dissipation efficiency of the packaged chip is low, an embodiment of this application provides a heat dissipation apparatus. The heat dissipation apparatus can perform partition-based heat dissipation on the plurality of chips in the packaged chip. This reduces heat impact between different chips, and effectively improves heat dissipation efficiency of the heat dissipation apparatus. Referring to FIG. 1, the heat dissipation apparatus 00 may include a heat dissipation substrate 001, a heat dissipation component 002, and a plurality of heat dissipation fins 003 disposed on a first side of the heat dissipation substrate 001. The heat dissipation fins 003 are configured to dissipate heat on the heat dissipation substrate 001. In an embodiment, the heat dissipation substrate 001, the heat dissipation component 002, and the heat dissipation fins 003 may all be made of copper.

A first surface of the heat dissipation component 002 is fastened on a second side of the heat dissipation substrate 001. There is a gap X between a side surface of the heat dissipation component 002 and the heat dissipation substrate 001. A second surface of the heat dissipation component 002 is configured to be attached to a first to-be-heat-dissipated component, to dissipate heat on the first to-be-heat-dissipated component. The first side and the second side of the heat dissipation substrate 001 are disposed opposite to each other. The first surface and the second surface of the heat dissipation component 002 are disposed opposite to each other on the heat dissipation component. The side surface is a surface on the heat dissipation component 002 other than the first surface and the second surface.

In an embodiment, the heat dissipation component 002 and the heat dissipation substrate 001 may be connected by welding or adhesive bonding. When the heat dissipation component 002 is connected to the heat dissipation substrate 001 by welding, thermal resistance between the heat dissipation component 002 and the heat dissipation substrate 001 can be reduced. Further, heat generated due to the thermal resistance is reduced.

An area that is on the second side of the heat dissipation substrate 001 and in which the heat dissipation component 002 is not disposed is used to be attached to another to-be-heat-dissipated component. Heating power of the first to-be-heat-dissipated component is greater than heating power of the another to-be-heat-dissipated component, and the another to-be-heat-dissipated component is a component other than the first to-be-heat-dissipated component.

Because there is the gap X between the side surface of the heat dissipation component 002 and the heat dissipation substrate 001, heat on the first to-be-heat-dissipated component cannot be transferred from the side surface of the heat dissipation component 002 to the another to-be-heat-dissipated component. Compared with a related technology, a heat transfer path is reduced. This reduces heat transferred between the first to-be-heat-dissipated component and the another to-be-heat-dissipated component, and further reduces heat impact between different to-be-heat-dissipated components. The heat dissipation substrate 001 can be used to effectively dissipate heat for the another to-be-heat-dissipated component. Therefore, heat dissipation efficiency of the heat dissipation apparatus 00 is improved.

For example, the first to-be-heat-dissipated component may be a main chip in a packaged chip, such as a CPU or a GPU, and the another to-be-heat-dissipated component may be another to-be-heat-dissipated component that is in the packaged chip and that is other than the main chip. For example, the another to-be-heat-dissipated component may be an HBM chip other than the GPU in the packaged chip or another to-be-heat-dissipated component with relatively low power consumption. When the heat dissipation component 002 is configured to dissipate heat for the main chip in the packaged chip, and when the area that is on the second side of the heat dissipation substrate 001 and in which the heat dissipation component 002 is not disposed is used for another chip in the packaged chip to dissipate heat, heat of the main chip cannot be transferred from the side surface of the heat dissipation component to the another chip. This reduces heat transferred between the main chip and the another chip, and further reduces heat impact between the main chip and the another chip. Therefore, a problem that heat dissipation efficiency of the packaged chip is relatively low can be resolved.

In an embodiment, a conductive-material interface layer may be disposed between the second surface of the heat dissipation component 002 and the first to-be-heat-dissipated component, and may be disposed between the area that is on the second side of the heat dissipation substrate 001 and in which the heat dissipation component 002 is not disposed and the another to-be-heat-dissipated component. The second surface of the heat dissipation component 002 is attached to the first to-be-heat-dissipated component by using the conductive-material interface layer, and the area that is on the second side of the heat dissipation substrate 001 and in which the heat dissipation component 002 is not disposed is attached to the another to-be-heat-dissipated component by using the conductive-material interface layer. The conductive-material interface layer may be made of materials such as thermally conductive silicone rubber and silicone grease. Compared with an embodiment in which the heat dissipation component 002 is in direct contact with the first to-be-heat-dissipated component and the heat dissipation substrate 001 is in direct contact with the another to-be-heat-dissipated component, the conductive-material interface layer is disposed. By disposing the conductive-material interface layer, thermal resistance generated due to direct contact can be reduced. The heat dissipation component 002 may be better attached to the first to-be-heat-dissipated component, and the heat dissipation substrate 001 may be better attached to the another to-be-heat-dissipated component, to ensure effective heat transfer. Therefore, the heat dissipation efficiency of the heat dissipation apparatus is improved. In addition, a risk of damaging a to-be-heat-dissipated component may be reduced.

It should be noted that the heat dissipation apparatus 00 is usually configured to dissipate heat for an object including a plurality of to-be-heat-dissipated components, and the plurality of to-be-heat-dissipated components may include at least one first to-be-heat-dissipated component and at least one another to-be-heat-dissipated component. Heat generated by the first to-be-heat-dissipated component is usually greater than heat generated by the another to-be-heat-dissipated component. In addition, in the heat dissipation apparatus 00, the heat dissipation component 002 is configured to dissipate heat for the first to-be-heat-dissipated component. Correspondingly, a location of the heat dissipation component 002 may be set based on a location of the first to-be-heat-dissipated component. For example, when the heat dissipation apparatus 00 is configured to dissipate heat for the packaged chip, the heat dissipation component 002 may be configured to dissipate heat for the main chip in the packaged chip. Correspondingly, the location of the heat dissipation component 002 may be set based on a location of the main chip.

For example, a location relationship between the heat dissipation component 002 and the first to-be-heat-dissipated component may meet the following: An orthographic projection of the heat dissipation component 002 on the heat dissipation substrate 001 overlaps an orthographic projection of the first to-be-heat-dissipated component on the heat dissipation substrate 001, or an orthographic projection of the heat dissipation component 002 on the heat dissipation substrate 001 covers an orthographic projection of the first to-be-heat-dissipated component on the heat dissipation substrate 001. A plurality of parallel projection lines illuminate a projected object in a direction perpendicular to a projection plane, and an obtained projection of the projected object on the projection plane is the orthographic projection. Correspondingly, a plurality of parallel projection lines illuminate the heat dissipation component 002 in a direction perpendicular to the heat dissipation substrate 001, and an obtained projection of the heat dissipation component 002 on the heat dissipation substrate 001 is the orthographic projection of the heat dissipation component 002 on the heat dissipation substrate 001. A plurality of parallel projection lines illuminate the first to-be-heat-dissipated component in the direction perpendicular to the heat dissipation substrate 001, and an obtained projection of the first to-be-heat-dissipated component on the heat dissipation substrate 001 is the orthographic projection of the first to-be-heat-dissipated component on the heat dissipation substrate 001.

When the orthographic projection of the heat dissipation component 002 on the heat dissipation substrate 001 covers the orthographic projection of the first to-be-heat-dissipated component on the heat dissipation substrate 001, the second surface of the heat dissipation component 002 includes an area in which the heat dissipation component 002 is attached to the first to-be-heat-dissipated component and an area in which the heat dissipation component 002 is no attached to the to-be-heat-dissipated component. Heat in the area in which the heat dissipation component 002 is attached to the first to-be-heat-dissipated component may be transferred to the area in which the heat dissipation component 002 is not attached to the to-be-heat-dissipated component. Therefore, heat can be dissipated by using the area in which the heat dissipation component 002 is not attached to the first to-be-heat-dissipated component. This increases a heat dissipation area for the first to-be-heat-dissipated component to dissipate heat, and further improves heat dissipation efficiency.

Figure 2:
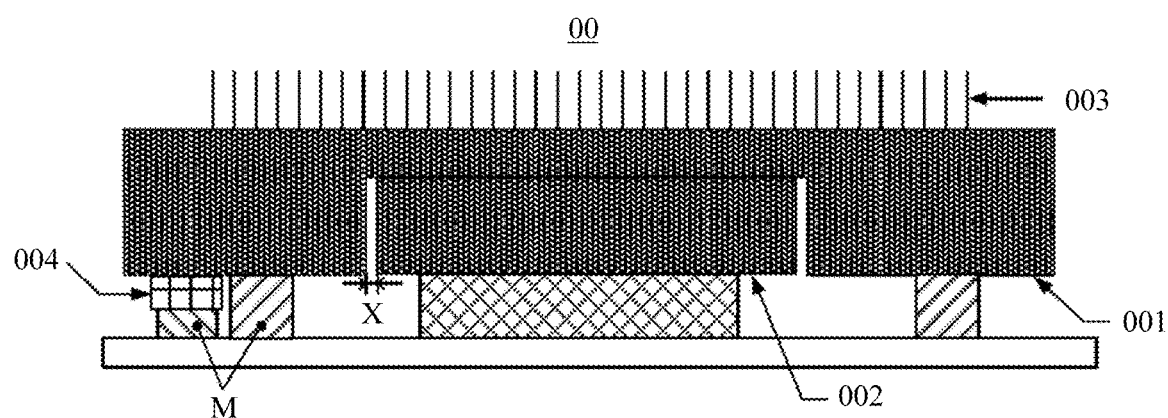
FIG. 2 is a schematic structural diagram of another heat dissipation apparatus according to an embodiment of this application.

In an embodiment, a height difference between a location of the second surface of the heat dissipation component 002 and a location of the second side of the heat dissipation substrate 001 in the area in which the heat dissipation component 002 is not disposed may be adjusted based on a thickness of the first to-be-heat-dissipated component and that of the another to-be-heat-dissipated component. In this way, both the heat dissipation component 002 and the heat dissipation substrate 001 can be well connected to the to-be-heat-dissipated component. For example, when a thickness difference between the another to-be-heat-dissipated component and the first to-be-heat-dissipated component is less than or equal to a thickness of the heat dissipation component 002, a first groove (not shown in FIG. 1) may be further disposed on the second side of the heat dissipation substrate 001, and the heat dissipation component 002 is disposed in the first groove. In this way, the second surface of the heat dissipation component 002 is attached to the first to-be-heat-dissipated component, and the area that is on the second side of the heat dissipation substrate 001 and in which the heat dissipation component 002 is not disposed is attached to the another to-be-heat-dissipated component. In addition, when the thickness of the another to-be-heat-dissipated component is equal to that of the first to-be-heat-dissipated component, the second surface of the heat dissipation component 002 is coplanar with an opening surface of the first groove. When the thickness difference between the another to-be-heat-dissipated component and the first to-be-heat-dissipated component is greater than the thickness of the heat dissipation component 002, a thermal pad may be further fastened on the second side of the heat dissipation substrate 001. In this way, the heat dissipation component 002 is fastened on the second side of the heat dissipation substrate 001 by using the thermal pad, to ensure that both the heat dissipation component 002 and the heat dissipation substrate 001 can be well connected to the to-be-heat-dissipated component. Similarly, when another to-be-heat-dissipated component includes at least two to-be-heat-dissipated components M, and there is a thickness difference between the at least two to-be-heat-dissipated components M, a thermal pad 004 (referring to FIG. 2) may also be correspondingly disposed on the second side of the heat dissipation substrate 001, to ensure that both the at least two to-be-heat-dissipated components M are attached to the heat dissipation substrate 001.

In an embodiment, to minimize heat exchange between the heat dissipation component 002 and the heat dissipation substrate 001 connected to the heat dissipation component 002, a thickness of the heat dissipation substrate 001 at the first groove may be less than a first threshold, and the first threshold may be set based on a service requirement. For example, the first threshold may be 5 millimeters.

Further, a closed vacuum cavity is disposed in the heat dissipation component 002. Alternatively, referring to FIG. 3, a vacuum cavity Q may be formed by enclosing a surface that is of the heat dissipation substrate 001 and that is located on the second side and an inner wall of the heat dissipation component 002. Working substance W may be disposed in the vacuum cavity, a volume of the working substance W in the vacuum cavity is less than a volume of the vacuum cavity, and the working substance is used to dissipate heat for the to-be-heat-dissipated component. For example, the volume V1 of the working substance W in the vacuum cavity and the volume V2 of the vacuum cavity may meet: $V1 = a \times V2$, and $a \in [0.3 \text{ to } 0.5]$. The working substance W may be a liquid with relatively good heat exchange performance, such as methanol, glycol solution, refrigerant, or water. In addition, to ensure that heat of the first to-be-heat-dissipated component can be effectively dissipated by using the vacuum cavity, the orthographic projection of the first to-be-heat-dissipated component on the heat dissipation substrate 001 is located in an orthographic projection of the vacuum cavity on the heat dissipation substrate 001.

In this way, when the heat of the first to-be-heat-dissipated component is transferred to the second surface (namely, the bottom of the vacuum cavity) of the heat dissipation component 002 that is attached to the first to-be-heat-dissipated component, the working substance W in the vacuum cavity may absorb the heat, and the working substance W is vaporized. The vaporized working substance W rises to the top of the vacuum cavity. Because a temperature at the top of the vacuum cavity is lower than a temperature at the bottom of the vacuum cavity, the working substance W that rises to the top of the vacuum cavity is liquefied as cooled, and flows back to the bottom of the vacuum cavity after liquefaction. This implements effective heat dissipation for the first to-be-heat-dissipated component.

In a process in which the heat of the first to-be-heat-dissipated component is transferred to the heat dissipation substrate 001 by using the working substance W in the vacuum cavity, a phase change occurs in the working substance W in the vacuum cavity. In other words, a state change occurs in the working substance W in the vacuum cavity, and first-time heat dissipation is implemented. After the heat is transferred to the heat dissipation substrate 001 by using the working substance W, a second-time heat dissipation may be implemented by using the heat dissipation substrate 001. Quick heat dissipation for the first to-be-heat-dissipated component can be implemented through the first-time heat dissipation and the second-time heat dissipation. In addition, because there is the gap X between the side surface of the heat dissipation component and the heat dissipation substrate 001, in a process in which the heat dissipation component 002 dissipates heat for the first to-be-heat-dissipated component, the heat on the first to-be-heat-dissipated component is not transferred to the another to-be-heat-dissipated component by using the heat dissipation substrate 001. Therefore, heat impact between the first to-be-heat-dissipated component and the another to-be-heat-dissipated component is reduced.

In an embodiment, a porous structure (not shown in FIG. 2) may be further disposed on an inner surface of the vacuum cavity. In an embodiment, the porous structure may be formed by laying copper powder on the inner surface of the vacuum cavity and sintering the copper powder. When a diameter of a copper powder particle is a second threshold (for example, the second threshold is 80 micrometers to 150 micrometers), in the porous structure, an aperture of each hole may be 50 micrometers to 80 micrometers. In this case, the porous structure may form a capillary structure inside the vacuum cavity. Due to capillary force provided by the capillary structure, the working substance W may be limited to be in a hole that is in the vacuum cavity and that is away from the first side of the heat dissipation substrate 001 (namely, the bottom of the vacuum cavity), so that the working substance W is centrally heated, to accelerate a vaporization process of the working substance W. Alternatively, the vaporized working substance W may be limited to be in a hole that is in the vacuum cavity and that is close to the first side of the heat dissipation substrate 001 (namely, the top of the vacuum cavity) in the porous structure, so that heat of the vaporized working substance W is centrally dissipated, to accelerate a liquefaction process of the vaporized working substance W. In addition, the liquefied working substance W may flow back to the bottom of the vacuum cavity due to the capillary force provided by the capillary structure, to implement circular flow of the working substance W in the vacuum cavity.

Figure 3:
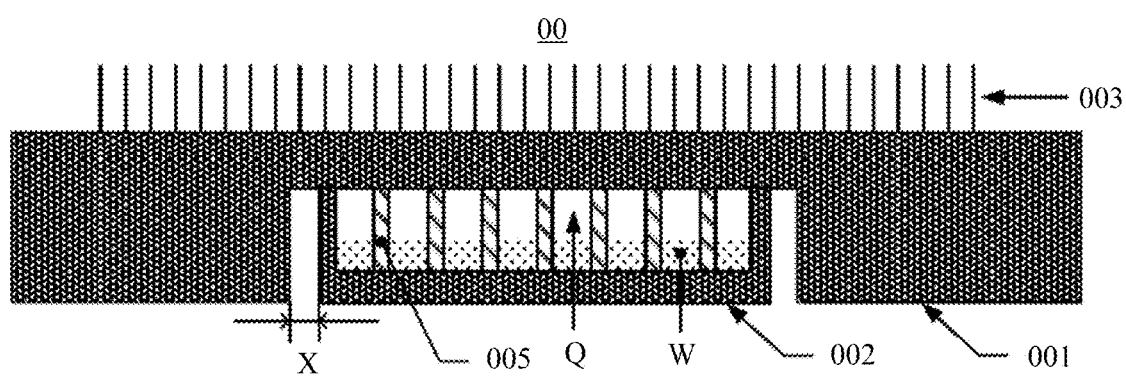
FIG. 3 is a schematic structural diagram of a vacuum cavity formed by enclosing a heat dissipation component and a heat dissipation substrate according to an embodiment of this application.

In addition, to improve a withstand capability and an anti-bending capability of the vacuum cavity, still referring to FIG. 3, a support cradle 005 may be further disposed inside the vacuum cavity. In an embodiment, the support cradle 005 may be made of copper. For example, the support cradle 005 may be a column structure formed by injecting copper powder into a mold and pressing and sintering the copper powder in the mold.

When a vacuum cavity is formed by enclosing a plurality of surfaces of the heat dissipation component 002, one end of the support cradle 005 is used to support the first surface of the heat dissipation component 002, and the other end of the support cradle 005 is used to support the second surface of the heat dissipation component 002. When the vacuum cavity is a cavity formed by enclosing the plurality of surfaces of the heat dissipation component 002 and a surface that is of the heat dissipation substrate 001 and that is on the second side, one end of the support cradle 005 is used to support the surface that is of the heat dissipation substrate 001 and that is on the second side, and the other end of the support cradle 005 is used to support the second surface that is of the heat dissipation component 002 and that is used to form the vacuum cavity.

Figure 4:
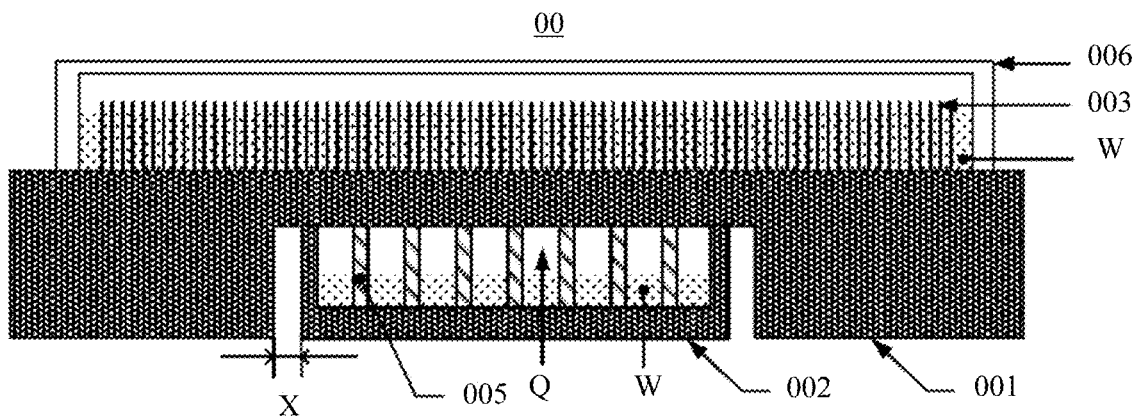
FIG. 4 is a schematic structural diagram of still another heat dissipation apparatus according to an embodiment of this application.

In an embodiment, referring to FIG. 4, the heat dissipation apparatus 00 may further include a protective housing 006 fastened on the heat dissipation substrate 001. The protective housing 006 covers the plurality of heat dissipation fins 003, the working substance W is disposed in a gap between the plurality of heat dissipation fins 003, and the gap between the plurality of heat dissipation fins 003 forms a flow path for the working substance W. The protective housing 006 covers the plurality of heat dissipation fins 003 to form closed space. The working substance flows in the closed space, and will not leak. The working substance W in the gap between the heat dissipation fins 003 is used to perform heat exchange with the heat dissipation substrate 001 and the heat dissipation fins 003, to dissipate heat on the heat dissipation substrate 001 and the heat dissipation fins 003. In addition, a working substance inlet (not shown in FIG. 4) and a working substance outlet (not shown in FIG. 4) are disposed opposite to each other on the protective housing 006. When heat on the to-be-heat-dissipated component is dissipated, the working substance W with a relatively low temperature may be input from the working substance inlet. When the working substance W flows, the working substance W may perform heat exchange with the heat dissipation fins 003 and the heat dissipation substrate 001, and flows out from the working substance outlet after heat dissipation, to implement convection heat dissipation for the heat dissipation substrate 001 and the heat dissipation fins 003, and further implement heat dissipation for the to-be-heat-dissipated component. The working substance W may be a liquid with relatively good heat exchange performance, such as methanol, glycol solution, refrigerant, or water. Locations of the working substance inlet and the working substance outlet may be determined based on an actual requirement. For example, the working substance inlet and the working substance outlet may be respectively set on two opposite side surfaces of the protective housing 006.

To further improve the heat dissipation efficiency of the heat dissipation apparatus 00, partition-based heat dissipation may be performed on the to-be-heat-dissipated component in a heat dissipation manner in which the heat dissipation fins 003 are partitioned. The partition-based heat dissipation may be implemented in at least the following a plurality of manners.

Figure 5:
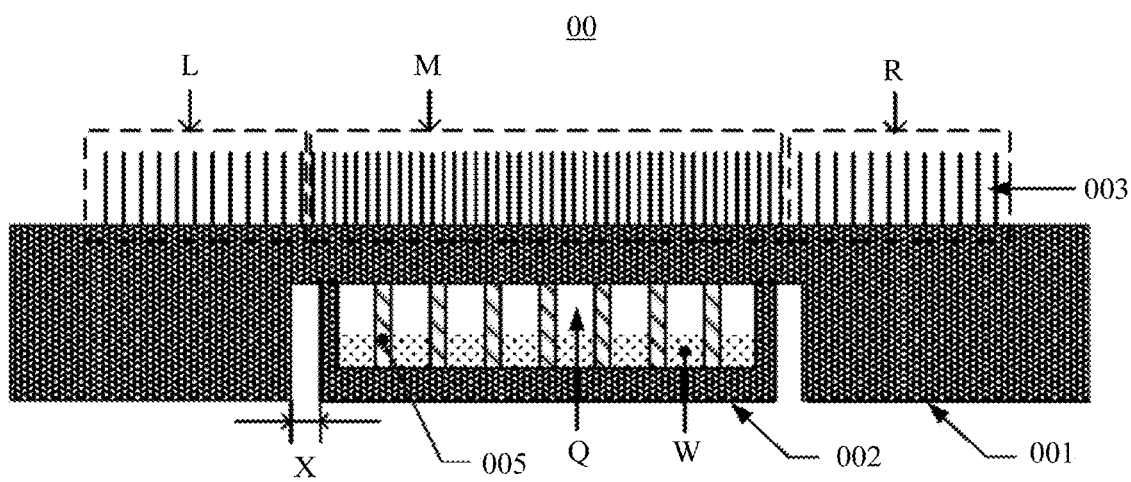
FIG. 5 is a schematic diagram in which a spacing between every two adjacent heat dissipation fins in a first area is less than a spacing between every two adjacent heat dissipation fins in a second area according to an embodiment of this application.

In an embodiment, referring to FIG. 5, a spacing between every two adjacent heat dissipation fins 003 in a first area (for example, a middle area M in FIG. 5) is less than a spacing between every two adjacent heat dissipation fins 003 in a second area (for example, a left area L and a right area R in FIG. 5), to implement partition of the heat dissipation fins 003. The partitioned heat dissipation fins 003 are used to dissipate heat. An orthographic projection of the first area on the heat dissipation substrate 001 covers the orthographic projection of the first to-be-heat-dissipated component on the heat dissipation substrate 001, and an orthographic projection of the second area on the heat dissipation substrate 001 covers an orthographic projection of the another to-be-heat-dissipated component on the heat dissipation substrate 001. When a spacing between the heat dissipation fins 003 in one area is different from a spacing between the heat dissipation fins 003 in another area, a heat dissipation area in the one area in which heat dissipation is performed by using the heat dissipation fins 003 is different from that in the another area. A heat dissipation area in an area in which a spacing between the heat dissipation fins 003 is relatively small is relatively large, and heat can be dissipated more quickly by using the relatively large heat dissipation area.

In addition, when a spacing between the heat dissipation fins 003 in one area is different from a spacing between the heat dissipation fins 003 in another area, and the working substance W is disposed in the gap between the heat dissipation fins 003, there is a difference between a flow speed and a flow volume of the working substance W in the one area and those in the another area. Correspondingly, heat dissipated by using the working substance W is different. In this way, partition-based heat dissipation is implemented in different areas. The difference may be represented as follows: When the spacing between the heat dissipation fins 003 is larger, a flow speed and a flow volume of the working substance W in a corresponding area are larger, and correspondingly, more heat is dissipated by using the working substance W. When the spacing between every two adjacent heat dissipation fins 003 in the first area is less than the spacing between every two adjacent heat dissipation fins 003 in the second area, partition-based heat dissipation can be implemented for the first to-be-heat-dissipated component corresponding to the first area and the another to-be-heat-dissipated component corresponding to the second area. In addition, heat dissipation for the another to-be-heat-dissipated component is accelerated, to overcome a heat dissipation bottleneck caused by a relatively low junction temperature of the another to-be-heat-dissipated component.

For example, Table 1 shows distribution of a flow speed and a flow volume of the working substance W in each of the left area L, the middle area M, and the right area R when a flow volume of the working substance at a working substance inlet is 1 liter/minute (LPM) and when a value of the spacing between the heat dissipation fins 003 in each of the left area L, the middle area M, and the right area R shown in FIG. 5 is different. Referring to Table 1, when spacings between the heat dissipation fins 003 in all areas are equal spacings, a flow speed of the working substance W in each of the left area L, the middle area M, and the right area R is 0.121 meters per second (m/s), 0.128 m/s, and 0.122 m/s, and a flow volume in each of the three areas is 0.293 LPM, 0.412 LPM, and 0.295 LPM. When the spacings between the heat dissipation fins 003 in the left area L, the middle area M, and the right area R are different spacings, a flow speed of the working substance W in each of the left area L, the middle area M, and the right area R is 0.156 m/s, 0.081 m/s, and 0.155 m/s, and a flow volume in each of the three areas is 0.372 LPM, 0.258 LPM, and 0.370 LPM. It can be learned from Table 1 that when the spacings between the heat dissipation fins 003 in the left area L, the middle area M, and the right area R are set to different spacings, both a flow speed and a flow volume of the working substance W in each of the left area L and the right area R increase by 27% relative to a flow speed and a flow volume of the working substance W in the middle area M, and a heat dissipation capability in the left area L and that in the right area R can be significantly improved. Therefore, partition-based heat dissipation can be implemented for the first to-be-heat-dissipated component and the another to-be-heat-dissipated component, to overcome a heat dissipation bottleneck caused by a relatively low junction temperature of the another to-be-heat-dissipated component. The equal spacings mean that spacings between the heat dissipation fins 003 in the left area L, the middle area M, and the right area R are all 0.35 millimeters. The different spacings mean that a spacing between the heat dissipation fins 003 in the middle area M is 0.35 millimeters, and both a spacing between the heat dissipation fins 003 in the left area L and a spacing between the heat dissipation fins 003 in the right area R are 0.5 millimeters.

TABLE 1

|  | Flow speed (unit: m/s) | | | Flow volume (unit: LPM) | | |
| --- | --- | --- | --- | --- | --- | --- |
|  | Left area | Middle area | Right area | Left area | Middle area | Right area |
| Equal spacing | 0.121 | 0.128 | 0.122 | 0.293 | 0.412 | 0.295 |
| Different spacing | 0.156 | 0.081 | 0.155 | 0.372 | 0.258 | 0.370 |

Figure 6:
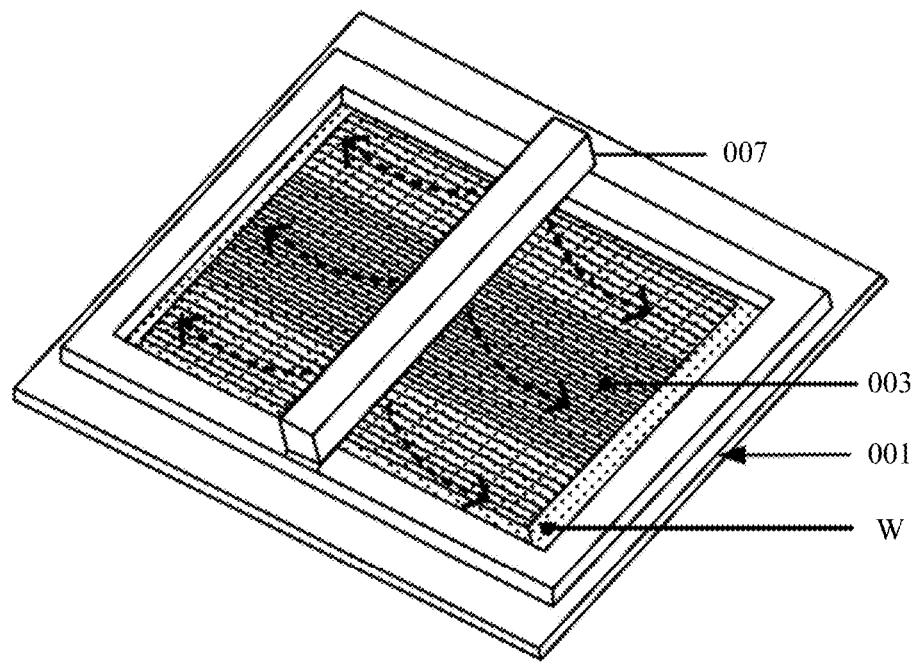
FIG. 6 is a schematic structural diagram of yet another heat dissipation apparatus according to an embodiment of this application.

In an embodiment, referring to FIG. 6, the heat dissipation apparatus 00 may further include a diverter component 007. The diverter component 007 is configured to separately input, into the first area and the second area, the working substance W input from the working substance inlet. A working substance outlet is disposed in each of the first area and the second area. Therefore, when the working substance W is separately input into the first area and the second area, based on a flow property of fluid, the working substance W in the first area tends to flow out by using the working substance outlet disposed in the first area, and the working substance W in the second area tends to flow out by using the working substance outlet disposed in the second area. This reduces a possibility of heat exchange between the working substance W in different areas, and ensures implementation of partition-based heat dissipation.

In an embodiment, referring to FIG. 6, the heat dissipation apparatus 00 may include the diverter component 007. Different resistance may be set at working substance inlets in different areas by using the diverter component 007, to control a flow speed of the working substance W in the first area and a flow speed of the working substance W in the second area, and/or to control a flow volume of the working substance W in the first area and a flow volume of the working substance W in the second area. Then heat dissipation is performed by using the working substance W with different flow speeds and/or different flow volumes, to further reduce a possibility of heat exchange between the working substance W in the different areas.

Figure 7:
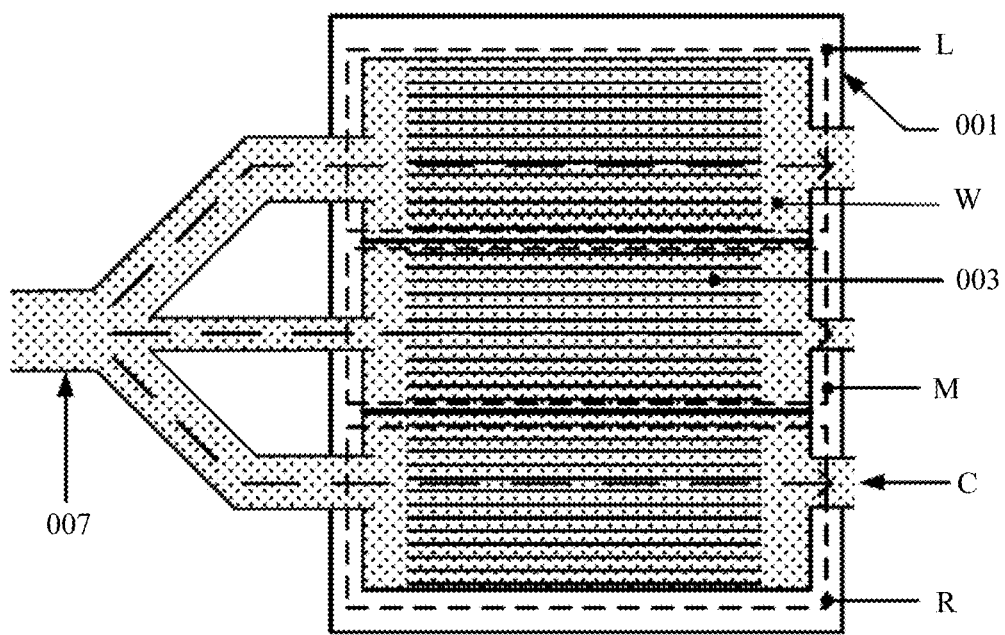
FIG. 7 is a schematic structural diagram of still yet another heat dissipation apparatus according to an embodiment of this application.

In an embodiment, referring to FIG. 7, a baffle plate may be further disposed on the first side that is of the heat dissipation substrate 001 and that is close to the heat dissipation fins 003. The baffle plate is configured to divide an area in which the heat dissipation fins 003 are located into the first area (for example, the area M in FIG. 7) and the second area (for example, the area L and the area R in FIG.

7) to implement partition of a flow path in the first area and the second area. In this way, the working substance W in the first area and the working substance W in the second area cannot be exchanged, and a possibility of heat exchange between the working substance W in different areas is reduced.

It should be noted that the four manners of implementing the partition-based heat dissipation may be independently used, or may be combined for use. This is not specifically limited in this embodiment of this application. For example, FIG. 6 is a schematic diagram of disposing the diverter component 007 in the heat dissipation apparatus 00. As shown in FIG. 6, an area on the heat dissipation substrate 001 is divided into the first area and the second area, and a working substance outlet (not shown in FIG. 6) is disposed in each area. In addition, the spacing between every two adjacent heat dissipation fins 003 in the first area is less than the spacing between every two adjacent heat dissipation fins 003 in the second area. After the diverter component 007 separately inputs the working substance W into the first area and the second area, the working substance W may flow to the working substance outlet in a corresponding area (a dashed line in FIG. 6 is a flow path of the working substance W) along the gap between the heat dissipation fins 003 in each area, to implement partition-based heat dissipation. FIG. 7 is a schematic diagram of disposing the diverter component 007 and the baffle plate in the heat dissipation apparatus 00. As shown in FIG. 7, the area on the heat dissipation substrate 001 is divided into the first area and the second area, and a working substance outlet C is disposed in each area. In addition, the baffle plate is disposed between the first area and the second area. After the diverter component 007 separately inputs the working substance W into the first area and the second area, the working substance W may flow to the working substance outlet in a corresponding area (a dashed line in FIG. 7 is a flow path of the working substance W) along the gap between the heat dissipation fins 003 in each area, to implement partition-based heat dissipation.

Figure 8:
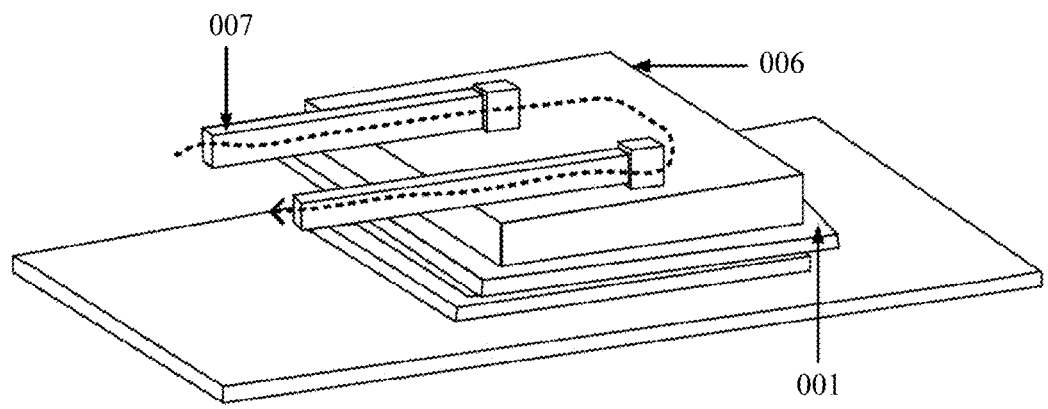
FIG. 8 is a schematic structural diagram of still yet another heat dissipation apparatus according to an embodiment of this application.

In addition, the heat dissipation fins 003 may be further designed, so that fluid may be guided to a specific direction in a working substance flow path formed by using the heat dissipation fins 003. For example, due to a guiding effect of the working substance flow path formed by using the heat dissipation fins 003, a flow direction of the working substance may be indicated by an arrow in FIG. 8.

Figure 9:
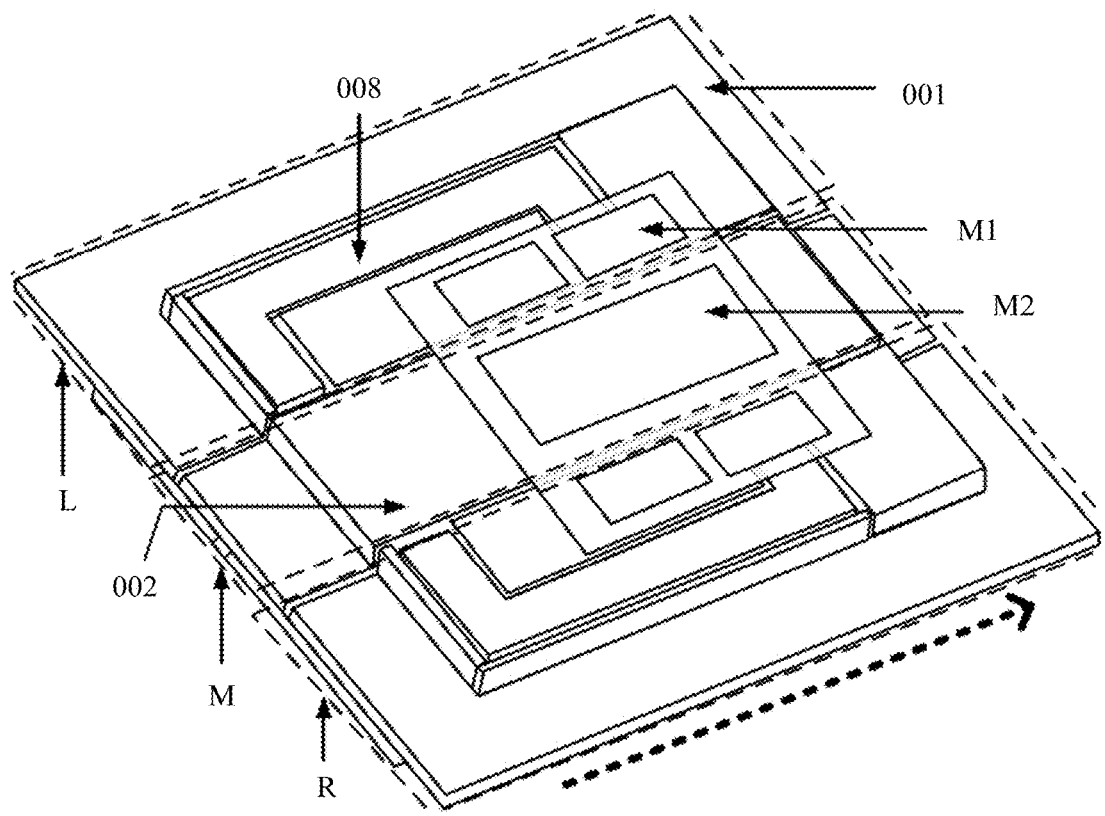
FIG. 9 is a schematic structural diagram of still yet another heat dissipation apparatus according to an embodiment of this application.

In an embodiment, to ensure effective heat dissipation for the another to-be-heat-dissipated component, referring to FIG. 9, the heat dissipation apparatus 00 may further include a heat pipe 008. One end of the heat pipe 008 may be embedded between the heat dissipation substrate 001 and a second to-be-heat-dissipated component M1, and the other end of the heat pipe 008 may be disposed at a working substance inlet (or another location with a relatively low temperature). The heat pipe 008 is configured to transfer heat on the second to-be-heat-dissipated component to the working substance inlet (or another location with a relatively low temperature). The second to-be-heat-dissipated component may be any one of other to-be-heat-dissipated components, and the another to-be-heat-dissipated component is a component other than the first to-be-heat-dissipated component M2.

In an embodiment, the to-be-heat-dissipated component may include a plurality of second to-be-heat-dissipated components, and the plurality of second to-be-heat-dissipated components may be sequentially arranged according to a flow direction of the working substance W. When heat of the another to-be-heat-dissipated component is dissipated by using the working substance W in the gap between the heat dissipation fins 003 and when the working substance W flows, heat of a second to-be-heat-dissipated component located upstream in the flow direction of the working substance (which is briefly referred to as an upstream second to-be-heat-dissipated component for ease of description) is transferred to a second to-be-heat-dissipated component located downstream in the direction of the working substance (which is briefly referred to as a downstream second to-be-heat-dissipated component for ease of description). Therefore, when the heat pipe 008 is disposed, the heat pipe 008 may be disposed only between the downstream second to-be-heat-dissipated component and the heat dissipation substrate 001, to transfer the heat on the downstream second to-be-heat-dissipated component to the working substance inlet by using the heat pipe 008. This implements heat dissipation for the downstream second to-be-heat-dissipated component, and avoids temperature concatenation caused by heat transfer from the upstream second to-be-heat-dissipated component to the downstream second to-be-heat-dissipated component. Along the flow direction of the working substance W, a second to-be-heat-dissipated component through which the working substance W flows first is the second to-be-heat-dissipated component located upstream in the flow direction of the working substance, and a second to-be-heat-dissipated component through which the working substance W flows next is the second to-be-heat-dissipated component located downstream in the flow direction of the working substance.

A height difference between a location of a first surface that is of the heat pipe 808 and that is used to be attached to the second to-be-heat-dissipated component and a location of the second side of the heat dissipation substrate 001 in an area in which the heat dissipation component 002 and the heat pipe 008 are not disposed may be adjusted based on a thickness difference between the second to-be-heat-dissipated component and a to-be-heat-dissipated component (which is still referred to as an another to-be-heat-dissipated component in the following for ease of description) that is in the other to-be-heat-dissipated components and that is other than the second to-be-heat-dissipated component. In this way, the heat pipe 008, the heat dissipation component 002, and the heat dissipation substrate 001 can all be well connected to the to-be-heat-dissipated component. For example, when a thickness difference between the another to-be-heat-dissipated component and the second to-be-heat-dissipated component is less than or equal to the thickness of the heat dissipation component 002, a second groove H2 may be further disposed on the second side of the heat dissipation substrate 001, and the heat pipe 008 is disposed in the second groove H2. In this way, a second surface of the heat pipe 008 is attached to the second to-be-heat-dissipated component, and an area that is on the second side of the heat dissipation substrate 001 and in which the heat pipe 008 and the heat dissipation component 002 are not disposed is attached to the another to-be-heat-dissipated component. In addition, when a thickness of the another to-be-heat-dissipated component is equal to that of the second to-be-heat-dissipated component, the second surface of the heat pipe 008 is coplanar with an opening surface of the second groove H2. When the thickness difference between the another to-be-heat-dissipated component and the second to-be-heat-dissipated component is greater than a thickness of the heat pipe 008, a thermal pad may be further fastened on the second side of the heat dissipation substrate 001. In this way, the heat pipe 008 is fastened on the second side of the heat dissipation substrate 001 by using the thermal pad, to ensure that the heat pipe 008, the heat dissipation component 002, and the heat dissipation substrate 001 can all be well connected to the to-be-heat-dissipated component.

The following uses FIG. 9 as an example to describe an embodiment in which the heat dissipation apparatus provided in this embodiment of this application dissipates heat.

As shown in FIG. 9, four second to-be-heat-dissipated components M1 are respectively disposed on two sides of the first to-be-heat-dissipated component M2. The second surface of the heat dissipation component 002 is attached to the first to-be-heat-dissipated component M2, and the area that is on the second side of the heat dissipation substrate 001 and in which the heat dissipation component 002 is not disposed is attached to the four second to-be-heat-dissipated components M1. In addition, there is the gap between the side surface of the heat dissipation component 002 and the heat dissipation substrate 001. In this way, heat on the first to-be-heat-dissipated component M2 cannot be transferred from the side surface of the heat dissipation component 002 to the second to-be-heat-dissipated component M1. This reduces heat transferred between the first to-be-heat-dissipated component M2 and the second to-be-heat-dissipated component M1, and reduces heat impact between the first to-be-heat-dissipated component M2 and the second to-be-heat-dissipated component M1. Therefore, heat dissipation efficiency of the heat dissipation apparatus 00 is improved.

In addition, still referring to FIG. 9, the orthographic projection of the heat dissipation component 002 on the heat dissipation substrate 001 covers the orthographic projection of the first to-be-heat-dissipated component M2 on the heat dissipation substrate 001. In other words, the second surface of the heat dissipation component 002 includes an area in which the heat dissipation component 002 is attached to the first to-be-heat-dissipated component M2 and an area in which the heat dissipation component 002 is not attached to a to-be-heat-dissipated component. Because heat in the area in which the heat dissipation component 002 is attached to the first to-be-heat-dissipated component M2 may be transferred to the area in which the heat dissipation component 002 is not attached to the to-be-heat-dissipated component, heat can be dissipated by using the area in which the heat dissipation component 002 is not attached to the first to-be-heat-dissipated component M2. This increases a dissipation area for heat dissipation for the first to-be-heat-dissipated component M2, and further improves the heat dissipation efficiency.

In addition, the heat dissipation fins are further partitioned on the first side of the heat dissipation substrate 001 based on locations of the four second to-be-heat-dissipated components M1 and a location of the first to-be-heat-dissipated component M2. For a grouping manner of the heat dissipation fins, refer to the partitioning manner shown in FIG. 7. The baffle plate is disposed between the second area (for example, the area L and the area R in FIG. 7 or FIG. 9) corresponding to the second to-be-heat-dissipated component M1 and the first area (for example, the area M in FIG. 7 or FIG. 9) corresponding to the first to-be-heat-dissipated component M2, and the working substance W is separately input into the first area and the second area by using the diverter component 007. The working substance W in the first area may flow to a working substance outlet in the first area along the gap between the heat dissipation fins 003 in the first area, and the working substance W in the second area may flow to a working substance outlet in the second area along the gap between the heat dissipation fins 003 in the second area. When the working substance W in the first area flows along the gap between the heat dissipation fins 003, heat exchange may be performed between the working substance W and the heat dissipation substrate 001 in the first area. When the working substance W in the second area flows along the gap between the heat dissipation fins 003, heat exchange may be performed between the working substance W and the heat dissipation substrate 001 in the second area. In addition, the working substance W may take heat away when flowing out of the working substance outlet, to dissipate heat for the heat dissipation substrate 001.

Further, when the working substance W in the heat dissipation fins 003 flows in a direction indicated by a dashed line arrow in FIG. 9, in each of the second area L and the second area R, the heat pipe 008 is further disposed between the second to-be-heat-dissipated component M1 disposed downstream in the flow direction of the working substance and the heat dissipation substrate 001. In addition, the other end of the heat pipe 008 is disposed upstream in the flow direction of the working substance, and the heat pipe 008 may transfer heat on the second to-be-heat-dissipated component M1 to an upstream location in the flow direction of the working substance with a relatively low temperature. This implements heat dissipation for the downstream second to-be-heat-dissipated component M1, and further prevents heat of the upstream second to-be-heat-dissipated component M1 from being cascaded with a temperature of the downstream second to-be-heat-dissipated component, to ensure that the heat dissipation apparatus performs effective heat dissipation.

It can be learned from the foregoing that heat dissipation efficiency of the heat dissipation apparatus provided in this embodiment of this application can be ensured. Therefore, when the heat dissipation apparatus is configured to dissipate heat for the packaged chip, the heat dissipation component is configured to dissipate heat for the main chip, for example, the GPU in the packaged chip, and the area that is on the second side of the heat dissipation substrate and in which the heat dissipation component is not disposed is used for the another chip, for example, the HBM chip, in the packaged chip to dissipate heat. Compared with a related technology, efficiency of dissipating heat for the packaged chip can be improved during heat dissipation.

Figure 10:
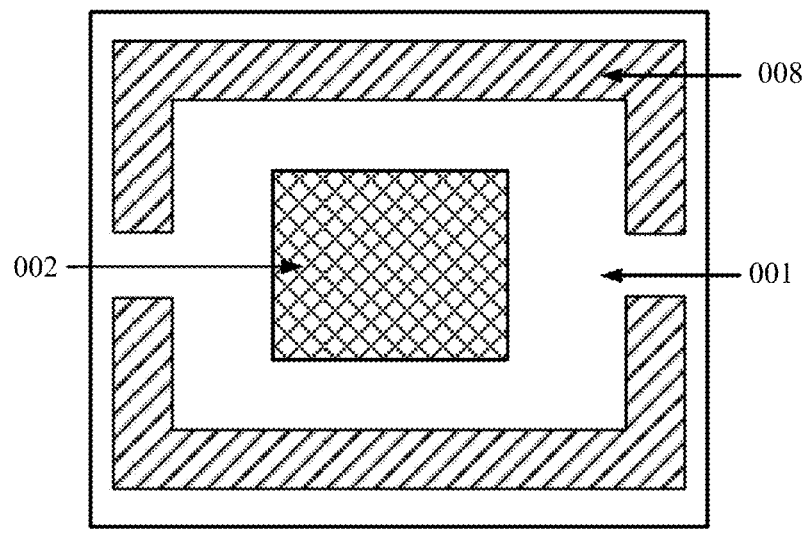
FIG. 10 is a schematic diagram of relative locations of a heat dissipation component and a heat pipe on a heat dissipation substrate according to an embodiment of this application.
Figure 11:
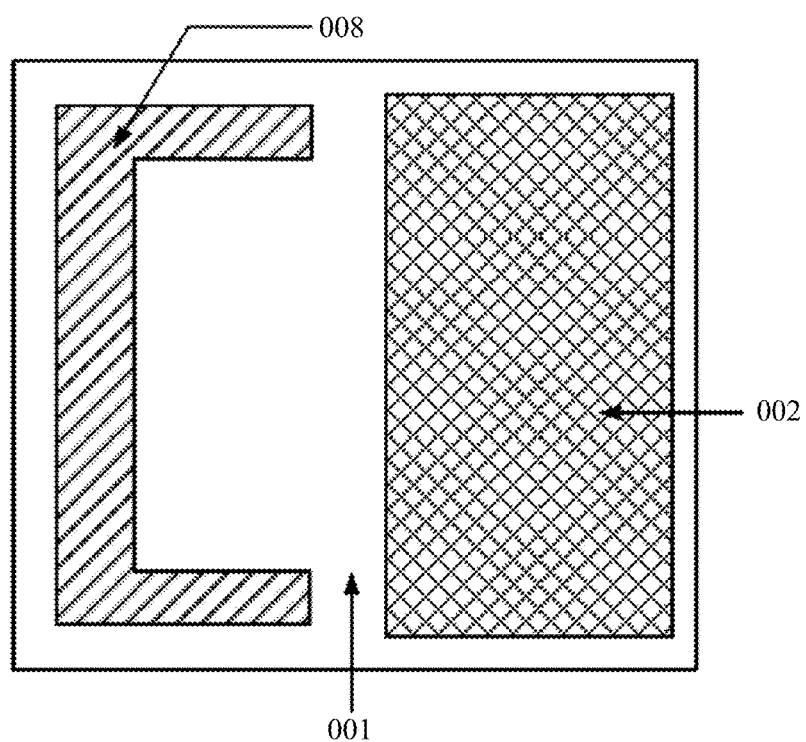
FIG. 11 is a schematic diagram of relative locations of a heat dissipation component and a heat pipe on a heat dissipation substrate according to an embodiment of this application.
Figure 12:
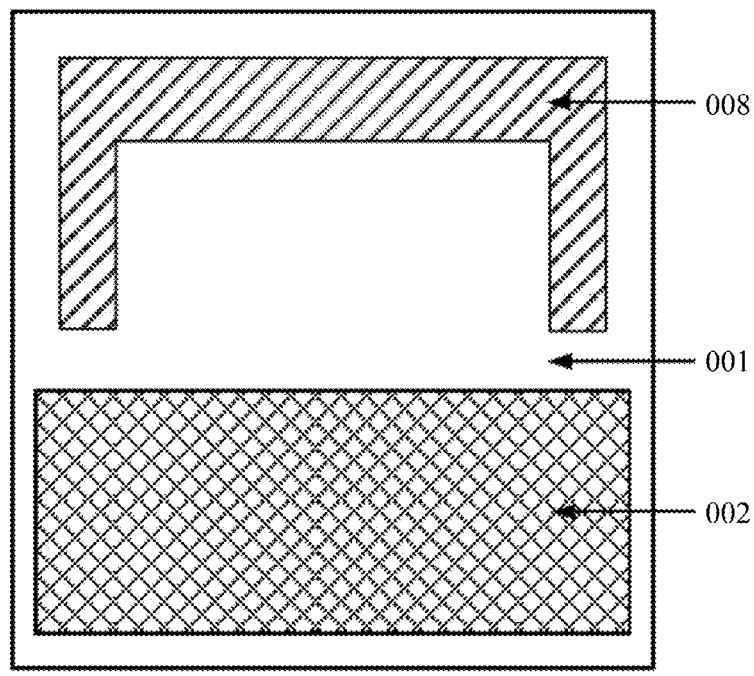
FIG. 12 is a schematic diagram of other relative locations of a heat dissipation component and a heat pipe on a heat dissipation substrate according to an embodiment of this application.
Figure 13:
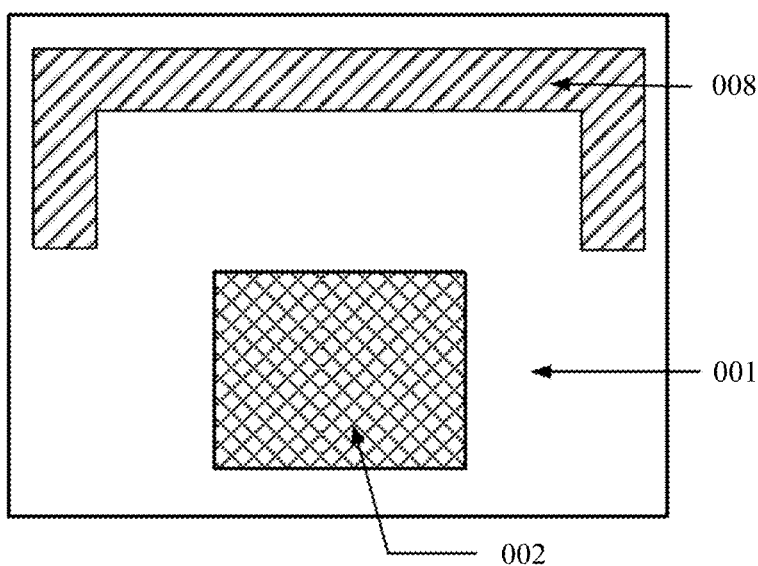
FIG. 13 is a schematic diagram of still other relative locations of a heat dissipation component and a heat pipe on a heat dissipation substrate according to an embodiment of this application.
Figure 14:
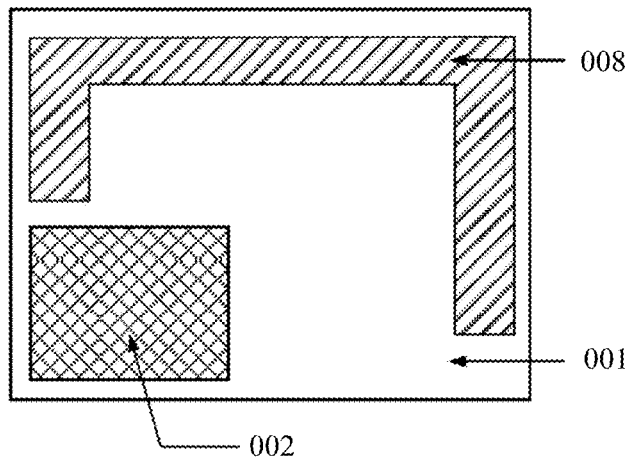
FIG. 14 is a schematic diagram of yet other relative locations of a heat dissipation component and a heat pipe on a heat dissipation substrate according to an embodiment of this application.

In an embodiment, a location and a disposed quantity of the heat dissipation components 002 and those of the heat pipes 008 may be adjusted based on a layout of the to-be-heat-dissipated component. For example, relative locations of the heat dissipation component 002 and the heat pipe 008 on the heat dissipation substrate 001 may include a surrounding/middle location (referring to FIG. 10), a two-side location (referring to FIG. 11), an upper-and-lower location (referring to FIG. 12), and a half-encircled location (referring to FIG. 13 and FIG. 14), or the like.

When heat dissipation is performed on the to-be-heat-dissipated component, the heat pipe 008 is configured to dissipate heat for the first to-be-heat-dissipated component, and the heat dissipation component 002 is configured to dissipate heat for the another to-be-heat-dissipated component. Alternatively, a plurality of heat dissipation components 002 may be disposed in the heat dissipation apparatus 00, and the plurality of heat dissipation components 002 separately dissipate heat for the first to-be-heat-dissipated component and the another to-be-heat-dissipated component. Alternatively, a plurality of heat pipes 008 may be disposed in the heat dissipation apparatus 00, and the plurality of heat pipes 008 separately dissipate heat for the first to-be-heat-dissipated component and the another to-be-heat-dissipated component. Alternatively, a plurality of heat pipes 008 and a plurality of heat dissipation components 002 may be disposed in the heat dissipation apparatus 00, and one or more heat pipes 008 may be combined with one or more heat dissipation components to dissipate heat for any to-be-heat-dissipated component.

In a heat dissipation simulation process, a plurality of heat dissipation apparatuses 00 dissipate heat for a plurality of servers. A packaged chip with a GPU of an NVIDIA P100 model that is under an evolved power consumption condition is deployed on each server, and a GPU (a case temperature specification is 105° C.) with power consumption of 420 watts and four HBM chips (a case temperature specification is 95° C.) with power consumption of 15 watts are packaged in the packaged chip. In addition, the working substance W disposed in each heat dissipation apparatus 00 is glycol solution, and a flow volume of the working substance W disposed in the gap between the heat dissipation fins 003 is 1 L/min. The following shows a simulation result.

When a first heat dissipation apparatus in the related technology is used to dissipate heat for the server, a temperature of the working substance W in a first area corresponding to the GPU is basically the same as a temperature of the working substance W in a second area corresponding to the HBM chip, and a temperature difference between the working substance W in the two areas is within 1 degree Celsius. When a second heat dissipation apparatus in which a working substance flow path is partitioned is used to dissipate heat, a difference between a temperature of the working substance W in a first area and a temperature of the working substance W in a second area reaches about 5 degrees Celsius. Compared with that the first heat dissipation apparatus is used to dissipate heat, the temperature of the working substance W in the second area is reduced. When the third heat dissipation apparatus 00 that is provided in this embodiment of this application and in which the working substance flow path and the heat dissipation substrate 001 are partitioned is used to dissipate heat, a difference between a temperature of the working substance W in the first area and a temperature of the working substance W in the second area reaches about 12 degrees Celsius. Compared with that the first heat dissipation apparatus is used to dissipate heat, the temperature of the working substance W in the second area decreases by about 4 degrees Celsius, and a case temperature of the HBM chip decreases by 3 to 4 degrees Celsius.

When the first heat dissipation apparatus and the third heat dissipation apparatus 00 are used to dissipate heat, for a temperature of the GPU and that of the HBM chip, refer to Table 2. It can be learned from Table 2 that when the first heat dissipation apparatus is used to dissipate heat, a case temperature of the HBM chip is higher than the case temperature specification of the HBM chip. When the third heat dissipation apparatus 00 is used to dissipate heat, there is a temperature margin of 2.9 degrees Celsius between the case temperature of the HBM chip and the case temperature specification of the HBM chip. Therefore, the heat dissipation apparatus 00 provided in this embodiment of this application can meet a heat dissipation requirement of the GPU and the HBM chip, and heat dissipation efficiency of the heat dissipation apparatus 00 is improved.

TABLE 2

| | | Case temperature specification | Temperature | Temperature margin |
|---|---|---|---|---|
| First heat dissipation apparatus | GPU | 105 | 88.2 | 16.8 |
| | HBM chip | 95 | 95.9 | −0.9 |
| Third heat dissipation apparatus | GPU | 105 | 90.2 | 14.8 |
| | HBM chip | 95 | 92.1 | 2.9 |

In an embodiment, a material of each component in the heat dissipation apparatus may be improved based on a simulation result of heat dissipation performed by the heat dissipation apparatus on a to-be-heat-dissipated component, to reduce costs of the improved heat dissipation apparatus in addition to ensuring heat dissipation efficiency. For example, a material with relatively low costs may be selected to manufacture a heat dissipation component, to reduce costs of the improved heat dissipation apparatus.

In conclusion, the heat dissipation apparatus provided in this embodiment of this application includes the heat dissipation substrate and the heat dissipation component. Because there is the gap between the side surface of the heat dissipation component and the heat dissipation substrate, heat on the first to-be-heat-dissipated component cannot be transferred from the side surface of the heat dissipation component to the another to-be-heat-dissipated component. Compared with the related technology, a heat transfer path is reduced. This reduces heat transferred between the first to-be-heat-dissipated component and the another to-be-heat-dissipated component, and further reduces heat impact between different to-be-heat-dissipated components. The heat dissipation substrate can be used to effectively dissipate heat for the another to-be-heat-dissipated component. This improves heat dissipation efficiency of the heat dissipation apparatus.

Figure 15:
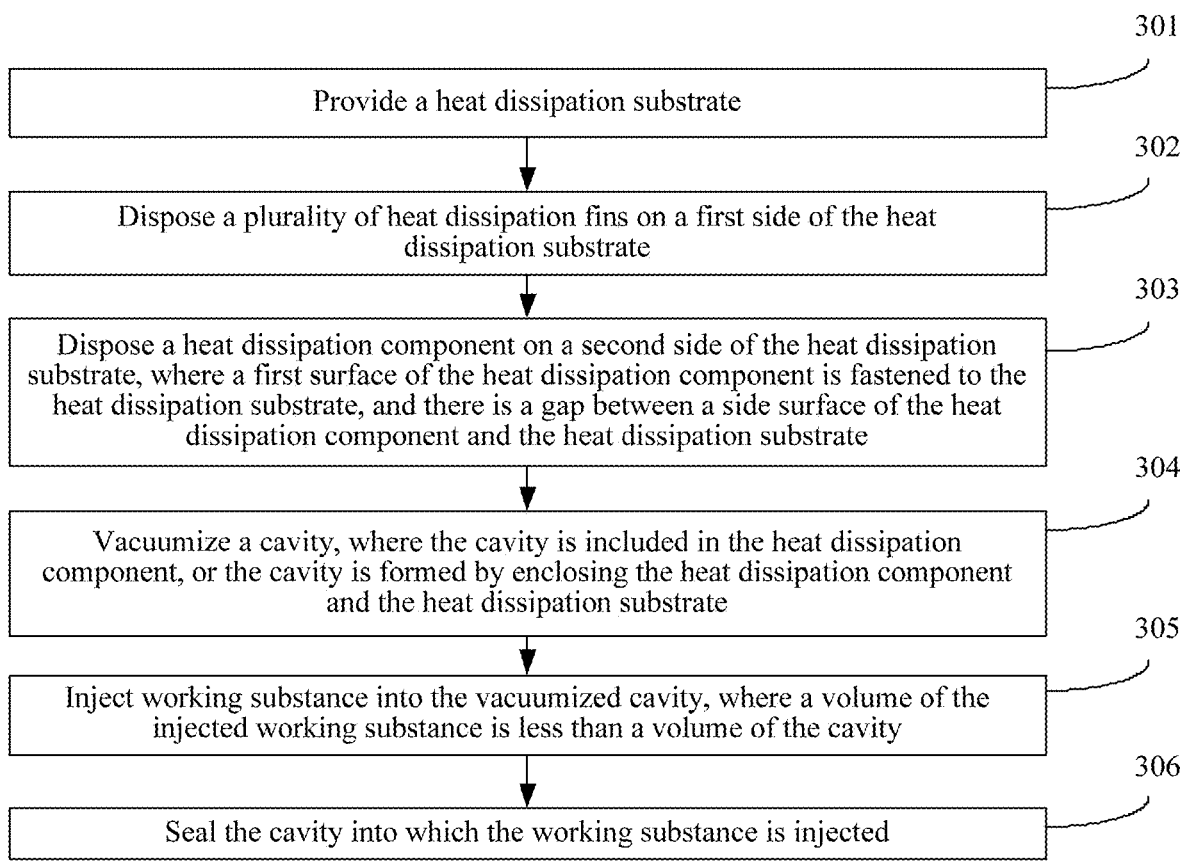
FIG. 15 is a flowchart of a method for manufacturing a heat dissipation apparatus according to an embodiment of this application.

FIG. 15 is a flowchart of a method for manufacturing a heat dissipation apparatus according to an embodiment of this application. As shown in FIG. 15, the method for manufacturing a heat dissipation apparatus may include the following operations.

Operation 301: Provide a heat dissipation substrate.

In an embodiment, the heat dissipation substrate may be made of copper.

Operation 302: Dispose a plurality of heat dissipation fins on a first side of the heat dissipation substrate.

The heat dissipation fins are configured to dissipate heat on the heat dissipation substrate. In an embodiment, the heat dissipation fins may be made of copper.

In addition, when the heat dissipation fins are disposed, the plurality of heat dissipation fins may be disposed at an equal spacing or different spacings. When the fins are disposed at different spacings, for an embodiment of the different spacings between the heat dissipation fins, refer to several embodiments of the partition-based heat dissipation fins in the foregoing heat dissipation apparatus embodiment. Details are not described herein again.

Operation 303: Dispose a heat dissipation component on a second side of the heat dissipation substrate, where a first surface of the heat dissipation component is fastened to the heat dissipation substrate, and there is a gap between a side surface of the heat dissipation component and the heat dissipation substrate.

A structure having a cavity may be disposed in the heat dissipation component, or the structure having a cavity may be formed by enclosing a surface that is of the heat dissipation substrate and that is located on the second side and an inner wall of the heat dissipation component. In addition, a second surface of the heat dissipation component is used to be attached to a first to-be-heat-dissipated component, to dissipate heat on the first to-be-heat-dissipated component. An area that is on the second side of the heat dissipation substrate and in which the heat dissipation component is not disposed is used to be attached to another to-be-heat-dissipated component. Heating power of the first to-be-heat-dissipated component is greater than heating power of the another to-be-heat-dissipated component, and the another to-be-heat-dissipated component is a component other than the first to-be-heat-dissipated component. In addition, the first side and the second side of the heat dissipation substrate are disposed opposite to each other on the heat dissipation substrate. The first surface and the second surface of the heat dissipation component are disposed opposite to each other on the heat dissipation component. The side surface is a surface on the heat dissipation component other than the first surface and the second surface. In an embodiment, the first surface of the heat dissipation component may be connected to the second side of the heat dissipation substrate by welding.

When the heat dissipation component is disposed, embodiments of disposing the heat dissipation component are different based on a thickness difference between the first to-be-heat-dissipated component and the another to-be-heat-dissipated component. For example, when the thickness difference between the another to-be-heat-dissipated component and the first to-be-heat-dissipated component is greater than a thickness of the heat dissipation component, a thermal pad may be first fastened on the second side of the heat dissipation substrate, and then the heat dissipation component is disposed on a first side that is of the thermal pad and that is away from the heat dissipation substrate. When the thickness difference between the another to-be-heat-dissipated component and the first to-be-heat-dissipated component is less than or equal to the thickness of the heat dissipation component, an embodiment of disposing the heat dissipation component on the second side of the heat dissipation substrate includes: disposing a first groove at a preset location on the second side of the heat dissipation substrate, and fastening the heat dissipation component in the first groove. A depth of the first groove is less than or equal to a thickness of the heat dissipation component in a direction of the depth.

Figure 16:
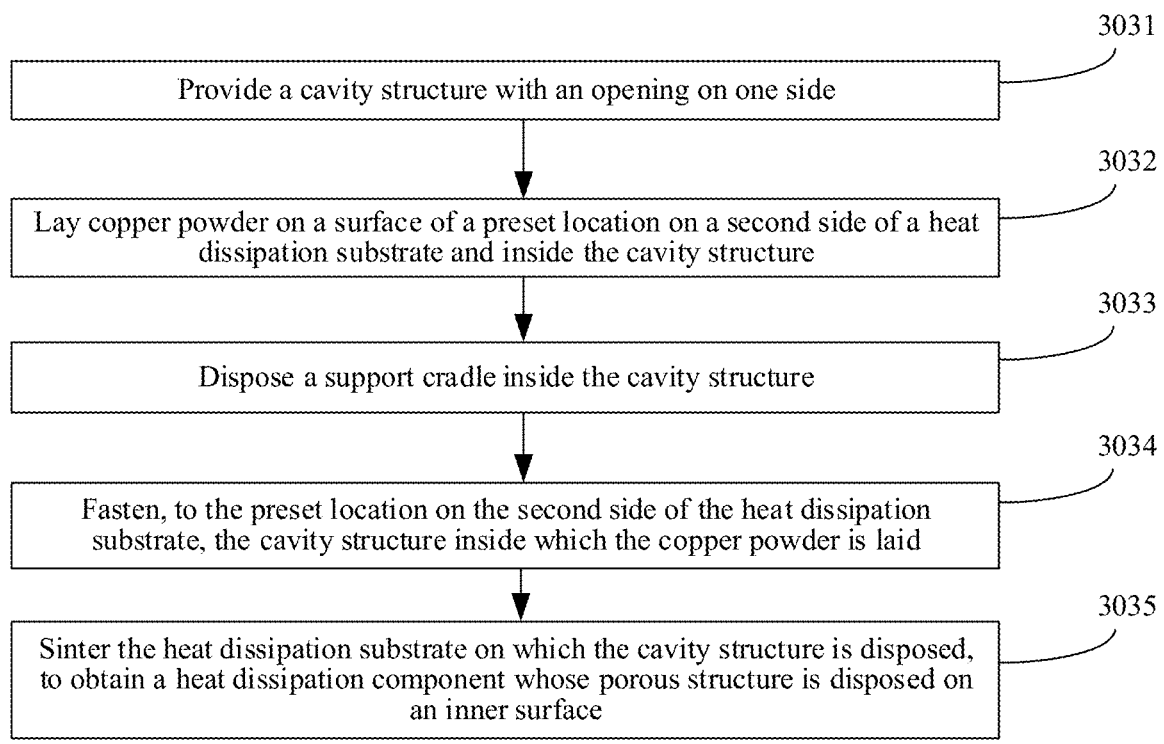
FIG. 16 is a flowchart of a method for disposing a heat dissipation component on a second side of a heat dissipation substrate according to an embodiment of this application.

In an embodiment, when the structure having a cavity is disposed on the heat dissipation component, the cavity structure may be disposed on the second side of the heat dissipation substrate according to the manner of disposing the heat dissipation component. When the heat dissipation component is a cavity structure with an opening, referring to FIG. 16, an embodiment of operation 303 may include the following operations.

Operation 3031: Provide a cavity structure with an opening on one side.

In an embodiment, the cavity structure with an opening on one side may be a structure such as a cube, a polygonal prism, or a cylinder with an opening on one side. This is not specifically limited in this embodiment of this application.

Operation 3032: Lay copper powder on a surface of the preset location on the second side of the heat dissipation substrate and inside the cavity structure.

The preset location is a location that is on the second side of the heat dissipation substrate and at which the heat dissipation component is expected to be disposed.

Operation 3033: Dispose a support cradle inside the cavity structure.

In an embodiment, the support cradle may be made of copper. For example, the support cradle may be a column structure formed by injecting copper powder into a mold and pressing and sintering the copper powder in the mold.

Operation 3034: Fasten, to the preset location on the second side of the heat dissipation substrate, the cavity structure inside which the copper powder is laid.

After the cavity structure inside which the copper powder is laid is fastened at the preset location on the second side of the heat dissipation substrate, a closed cavity structure is formed by enclosing the cavity structure with an opening on one side and the surface that is of the heat dissipation substrate and that is located on the second side. In this case, one end of the support cradle is used to support the second side of the heat dissipation substrate forming the vacuum cavity, and the other end of the support cradle is used to support a surface that is of the heat dissipation component forming the vacuum cavity and that is located on the second side, to improve a withstand capability and an anti-bending capability of the vacuum cavity.

It should be noted that, when the heat dissipation component is a closed cavity structure, the support cradle may also be disposed inside the heat dissipation component. In this case, the one end of the support cradle is used to support the first surface of the heat dissipation component, and the other end of the support cradle is used to support the second surface of the heat dissipation component.

Operation 3035: Sinter the heat dissipation substrate on which the cavity structure is disposed, to obtain the heat dissipation component whose porous structure is disposed on an inner surface.

The porous structure may form a capillary structure inside the vacuum cavity. Due to capillary force provided by the capillary structure, working substance may be limited to be in a hole that is in the vacuum cavity and that is away from the first side of the heat dissipation substrate (namely, the bottom of the vacuum cavity), so that the working substance is centrally heated, to accelerate a vaporization process of the working substance. Alternatively, the vaporized working substance may be limited to be in a hole that is in the vacuum cavity and that is close to the first side of the heat dissipation substrate (namely, the top of the vacuum cavity) in the porous structure, so that heat of the vaporized working substance is centrally dissipated, to accelerate a liquefaction process of the vaporized working substance. In addition, the liquefied working substance may flow back to the bottom of the vacuum cavity due to the capillary force provided by the capillary structure, to implement circular flow of the working substance in the vacuum cavity.

In an embodiment, a heat pipe may also be disposed on the second side of the heat dissipation substrate. For a manner of disposing the heat pipe, refer to a manner of disposing the heat dissipation component, and a location of the heat pipe may be determined based on an actual requirement. For example, when the heat pipe is configured to dissipate heat for a second to-be-heat-dissipated component, and the working substance in a gap between the heat dissipation fins is used to dissipate heat for the second to-be-heat-dissipated component, a location of the heat pipe may be as follows: One end of the heat pipe is embedded between the heat dissipation substrate and the second to-be-heat-dissipated component, and the other end of the heat pipe is disposed at a working substance inlet (or another location with a relatively low temperature). The heat pipe is configured to transfer heat on the second to-be-heat-dissipated component to the working substance inlet (or another location with a relatively low temperature).

Operation 304: Vacuumize the cavity, where the cavity is included in the heat dissipation component, or the cavity is formed by enclosing the heat dissipation component and the heat dissipation substrate.

Operation 305: Inject working substance into the vacuumized cavity, where a volume of the injected working substance is less than a volume of the cavity.

The working substance may be a liquid with relatively good heat exchange performance, such as methanol, glycol solution, refrigerant, or water. In addition, the volume V1 of the working substance in the vacuum cavity and the volume V2 of the vacuum cavity may meet: $V1=a \times V2$, and $a \in [0.3$ to $0.5]$.

Operation 306: Seal the cavity into which the working substance is injected.

Sealing treatment is used to maintain the cavity in a vacuum state, to ensure circular flow of the working substance in the cavity.

It should be noted that, to ensure that the heat pipe, the heat dissipation component, and an area that is on the second side of the heat dissipation substrate and in which the heat pipe and the heat dissipation component is not disposed in the heat dissipation apparatus are well connected to a to-be-heat-dissipated component, after operation 301 to operation 306 are completed, milling processing may be further performed on a bottom surface of the heat dissipation substrate. In this way, the heat dissipation component, the heat pipe, and the heat dissipation substrate can all be well connected to the to-be-heat-dissipated component.

In conclusion, the heat dissipation apparatus manufactured according to the method for manufacturing a heat dissipation apparatus provided in this embodiment of this application includes the heat dissipation substrate and the heat dissipation component. Because there is the gap between the side surface of the heat dissipation component and the heat dissipation substrate, the heat on the first to-be-heat-dissipated component cannot be transferred from the side surface of the heat dissipation component to the another to-be-heat-dissipated component. Compared with a related technology, a heat transfer path is reduced. This reduces heat transferred between the first to-be-heat-dissipated component and the another to-be-heat-dissipated component, and further reduces heat impact between different to-be-heat-dissipated components. The heat dissipation substrate can be used to effectively dissipate heat for the another to-be-heat-dissipated component. This improves heat dissipation efficiency of the heat dissipation apparatus.

It should be noted that sequential order of operations of the method for manufacturing a heat dissipation apparatus provided in this embodiment of the present disclosure may be properly adjusted, and an operation may be correspondingly added or deleted based on a situation. Any variation readily figured out by a person skilled in the art within the technical scope disclosed in the present disclosure shall fall within the protection scope of the present disclosure. Details are not described herein again.

An embodiment of this application provides a server. The server may include a server chassis and a heat dissipation apparatus. A first to-be-heat-dissipated component and another to-be-heat-dissipated component are disposed in the server chassis. The heat dissipation apparatus includes the heat dissipation apparatus shown in any one of FIG. 1 to FIG. 9. The heat dissipation apparatus is configured to dissipate heat for the first to-be-heat-dissipated component and the another to-be-heat-dissipated component in the server chassis.

In an embodiment, the first to-be-heat-dissipated component and the another to-be-heat-dissipated component are packaged in a packaged chip, and the heat dissipation apparatus is attached to the packaged chip.

In conclusion, the server provided in this embodiment of this application includes the heat dissipation apparatus, and the heat dissipation apparatus is configured to dissipate heat for the first to-be-heat-dissipated component and the another to-be-heat-dissipated component in the server chassis. Because the heat dissipation apparatus includes a heat dissipation substrate and a heat dissipation component, and there is a gap between a side surface of the heat dissipation component and the heat dissipation substrate, heat on the first to-be-heat-dissipated component cannot be transferred from the side surface of the heat dissipation component to the another to-be-heat-dissipated component. Compared with a related technology, a heat transfer path is reduced. This reduces heat transferred between the first to-be-heat-dissipated component and the another to-be-heat-dissipated component, and further reduces heat impact between different to-be-heat-dissipated components. The heat dissipation substrate can be used to effectively dissipate heat for the another to-be-heat-dissipated component. This improves heat dissipation efficiency of the heat dissipation apparatus, and working efficiency of the server is improved.

A person of ordinary skill in the art may understand that all or some of the operations of the embodiments may be implemented by hardware or a program instructing related hardware. The program may be stored in a computer-readable storage medium. The storage medium may include a read-only memory, a magnetic disk, or an optical disc.

The foregoing descriptions are merely example embodiments of this application, but are not intended to limit this application. Any modification, equivalent replacement, or improvement made without departing from the principle of this application should fall within the protection scope of this application.

What is claimed is:

1. A heat dissipation apparatus comprising:
   a heat dissipation substrate;
   a plurality of heat dissipation fins disposed on a first side of the heat dissipation substrate, the plurality of heat dissipation fins are configured to conduct heat of the heat dissipation substrate to outside of the heat dissipation apparatus;
   a heat dissipation component, a first surface of the heat dissipation component is fastened on a second side of the heat dissipation substrate and the first side is disposed opposite to the second side, wherein,
   a surface of the heat dissipation component attached to a first to-be-heat-dissipated component comprises a first heat dissipation region, the first heat dissipation region is configured to conduct heat of the first to-be-heat-dissipated component to the plurality of heat dissipation fins; and
   a surface of the heat dissipation substrate attached to a second to-be-heat-dissipated component comprises a second heat dissipation region, the second heat dissipation region is configured to conduct heat of the second to-be-heat-dissipated component to the plurality of heat dissipation fins, and a gap exists between the first heat dissipation region and the second heat dissipation region.

2. The heat dissipation apparatus of claim 1, wherein, the first to-be-heat-dissipated component comprises a processor and the second to-be-heat-dissipated component comprises a storage component.

3. The heat dissipation apparatus of claim 1, wherein, a vacuum cavity is disposed in the heat dissipation component, a working substance is disposed in the vacuum cavity, a volume of the working substance is less than a volume of the vacuum cavity, and the working substance is used to dissipate heat for a to-be-heat-dissipated component.

4. The heat dissipation apparatus of claim 1, wherein, a vacuum cavity is formed by enclosing a surface that is of the heat dissipation substrate and that is located on the second side and an inner wall of the heat dissipation component, a working substance is disposed in the vacuum cavity, a volume of the working substance is less than a volume of the vacuum cavity, and the working substance is used to dissipate heat for a to-be-heat-dissipated component.

5. The heat dissipation apparatus of claim 3, wherein, a porous structure is disposed on an inner surface of the vacuum cavity.

6. The heat dissipation apparatus of claim 3, wherein, an orthographic projection of the first to-be-heat-dissipated component on the heat dissipation substrate is located in an orthographic projection of the vacuum cavity on the heat dissipation substrate.

7. The heat dissipation apparatus of claim 3, wherein, a support cradle is disposed inside the vacuum cavity.

8. The heat dissipation apparatus of claim 1, wherein, a spacing between every two adjacent heat dissipation fins located in a first area is less than a spacing between every two adjacent heat dissipation fins located in a second area, an orthographic projection of the first area on the heat dissipation substrate covers an orthographic projection of the first to-be-heat-dissipated component on the heat dissipation substrate, and an orthographic projection of the second area on the heat dissipation substrate covers an orthographic projection of the second to-be-heat-dissipated component on the heat dissipation substrate.

9. The heat dissipation apparatus of claim 1, wherein, the heat dissipation apparatus further comprises a protective housing fastened on the heat dissipation substrate, the protective housing covers the plurality of heat dissipation fins, and a working substance is disposed in a gap between the plurality of heat dissipation fins.

10. The heat dissipation apparatus of claim 8, wherein, the heat dissipation apparatus further comprises a diverter component, and the diverter component is configured to separately input, into a first area and a second area, a working substance input from a working substance inlet; and a working substance outlet is disposed in each of the first area and the second area, an orthographic projection of the first area on the heat dissipation substrate covers an orthographic projection of the heat dissipation component on the heat dissipation substrate, and an orthographic projection of the second area on the heat dissipation substrate does not overlap the orthographic projection of the heat dissipation component on the heat dissipation substrate.

11. A server including a heat dissipation apparatus comprising:
a heat dissipation substrate;
a plurality of heat dissipation fins disposed on a first side of the heat dissipation substrate, the plurality of heat dissipation fins are configured to conduct heat of the heat dissipation substrate to outside of the heat dissipation apparatus;

a heat dissipation component, a first surface of the heat dissipation component is fastened on a second side of the heat dissipation substrate and the first side is disposed opposite to the second side, wherein, a surface of the heat dissipation component attached to a first to-be-heat-dissipated component comprises a first heat dissipation region, the first heat dissipation region is configured to conduct heat of the first to-be-heat-dissipated component to the plurality of heat dissipation fins; and a surface of the heat dissipation substrate attached to a second to-be-heat-dissipated component comprises a second heat dissipation region, the second heat dissipation region is configured to conduct heat of the second to-be-heat-dissipated component to the plurality of heat dissipation fins, and a gap exists between the first heat dissipation region and the second heat dissipation region.

12. The server of claim 11, wherein, the first to-be-heat-dissipated component comprises a processor and the second to-be-heat-dissipated component comprises a storage component.

13. The server of claim 11, wherein, a vacuum cavity is disposed in the heat dissipation component, a working substance is disposed in the vacuum cavity, a volume of the working substance is less than a volume of the vacuum cavity, and the working substance is used to dissipate heat for a to-be-heat-dissipated component.

14. The server of claim 11, wherein, a vacuum cavity is formed by enclosing a surface that is of the heat dissipation substrate and that is located on the second side and an inner wall of the heat dissipation component, a working substance is disposed in the vacuum cavity, a volume of the working substance is less than a volume of the vacuum cavity, and the working substance is used to dissipate heat for a to-be-heat-dissipated component.

15. The server of claim 13, wherein, a porous structure is disposed on an inner surface of the vacuum cavity.

16. The server of claim 13, wherein, an orthographic projection of the first to-be-heat-dissipated component on the heat dissipation substrate is located in an orthographic projection of the vacuum cavity on the heat dissipation substrate.

17. The server of claim 13, wherein, a support cradle is disposed inside the vacuum cavity.

18. The server of claim 11, wherein, a spacing between every two adjacent heat dissipation fins located in a first area is less than a spacing between every two adjacent heat dissipation fins located in a second area, an orthographic projection of the first area on the heat dissipation substrate covers an orthographic projection of the first to-be-heat-dissipated component on the heat dissipation substrate, and an orthographic projection of the second area on the heat dissipation substrate covers an orthographic projection of the second to-be-heat-dissipated component on the heat dissipation substrate.

19. The server of claim 11, wherein, the heat dissipation apparatus further comprises a protective housing fastened on the heat dissipation substrate, the protective housing covers the plurality of heat dissipation fins, and a working substance is disposed in a gap between the plurality of heat dissipation fins.

20. The server of claim 18, wherein, the heat dissipation apparatus further comprises a diverter component, and the diverter component is configured to separately input, into a first area and a second area, a working substance input from a working substance inlet; and a working substance outlet is disposed in each of the first area and the second area, an orthographic projection of the first area on the heat dissipation substrate covers an orthographic projection of the heat dissipation component on the heat dissipation substrate, and an orthographic projection of the second area on the heat dissipation substrate does not overlap the orthographic projection of the heat dissipation component on the heat dissipation substrate.

* * * * *